United States Patent
Tan et al.

(10) Patent No.: US 10,483,142 B1
(45) Date of Patent: Nov. 19, 2019

(54) VACUUM ROBOT POSITIONING SYSTEM WITH REDUCED SENSITIVITY TO CHAMBER PRESSURE

(71) Applicant: Lam Research Corporation, Fremont, CA (US)

(72) Inventors: Mark K. Tan, San Jose, CA (US); Christopher William Burkhart, Los Gatos, CA (US); Richard M. Blank, San Jose, CA (US); Richard H. Gould, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/132,326

(22) Filed: Sep. 14, 2018

(51) Int. Cl.
| | |
|---|---|
| *H01L 21/677* | (2006.01) |
| *H01L 21/687* | (2006.01) |
| *H01L 21/67* | (2006.01) |
| *H01L 21/68* | (2006.01) |

(52) U.S. Cl.
CPC .. *H01L 21/67742* (2013.01); *H01L 21/67196* (2013.01); *H01L 21/68* (2013.01); *H01L 21/68707* (2013.01); *H01L 21/68714* (2013.01)

(58) Field of Classification Search
CPC .................. H01L 21/67742; B25J 21/005
See application file for complete search history.

(56) References Cited

U.S. PATENT DOCUMENTS

| | | | | |
|---|---|---|---|---|
| 5,064,340 | A * | 11/1991 | Genov | ..... B25J 9/042 414/744.5 |
| 5,746,565 | A | 5/1998 | Tepolt | |
| 5,988,971 | A | 11/1999 | Fossey et al. | |
| 9,076,829 | B2 * | 7/2015 | Brodine | ..... H01L 21/67742 |
| 9,764,461 | B2 * | 9/2017 | Yazawa | ..... B25J 19/0054 |
| 10,226,863 | B2 * | 3/2019 | Yazawa | ..... B25J 19/0054 |
| 10,265,845 | B2 * | 4/2019 | Yazawa | ..... B25J 19/0054 |

* cited by examiner

*Primary Examiner* — Jonathan Snelting
(74) *Attorney, Agent, or Firm* — Weaver Austin Villeneuve & Sampson LLP

(57) ABSTRACT

A system for mounting vacuum robot arms in horizontally elongate vacuum transfer modules is provided. The system provides mechanical isolation to the vacuum robot arm against deflections in the housing of the vacuum transfer module due to depressurization of the interior of the vacuum transfer module while the exterior of the vacuum transfer module is subjected to atmospheric pressure. Such systems may prevent undesirable, larger displacements of the end effector of such vacuum robot arms due to the deflection.

19 Claims, 15 Drawing Sheets

VACUUM ROBOT POSITIONING SYSTEM WITH REDUCED SENSITIVITY TO CHAMBER PRESSURE

BACKGROUND

Some semiconductor processing tools feature multiple processing chambers that are arranged around a central hub chamber that houses one or more robot arms that may be used to transfer semiconductor wafers from a one of the processing chambers, into the hub chamber, and then into another processing chamber. Such hub chambers are typically referred to as "transfer modules," and may also be connected with other types of chambers, e.g., load locks, furnaces, etc. Transfer modules are frequently designed to have radial symmetry, thus allowing the robot arm length to be minimized and allowing for the arm, in some configurations, to be able to be rotated 360° within the transfer module without colliding with anything.

In some semiconductor processing tools, the transfer module may be held at vacuum or near-vacuum conditions during normal operation; such transfer chambers are referred to as "vacuum transfer modules" ("vacuum transfer chamber" and "vacuum transfer module" are used herein in a generally interchangeable manner, and reference to one is to be understood to also include reference to the other). Such vacuum transfer modules may be hermetically sealed and may utilize special robots referred to as vacuum robots (or vacuum robot arms) that utilize special rotational joints, such as rotational joints having ferrofluidic seals, that permit rotational movement of the robot arm segments while preventing fluids from being sucked into the vacuum transfer module through such rotational joints. In order to provide for a vacuum-tight seal between such vacuum robots and the vacuum transfer chamber, such vacuum robots are typically bolted directly to the underside of the housing of the vacuum transfer chamber by way of a circumferential flange with some form of mechanical seal sandwiched between the flange and the underside of the housing.

SUMMARY

Details of one or more implementations of the subject matter described in this specification are set forth in the accompanying drawings and the description below. Other features, aspects, and advantages will become apparent from the description, the drawings, and the claims.

In some implementations, an apparatus may be provided that includes a support structure for mounting a vacuum robot arm to a horizontally elongate vacuum transfer module for a semiconductor processing tool. The support structure may include a first set of one or more vacuum transfer module mount points collectively having a first centroid, a second set of one or more vacuum transfer module mount points collectively having a second centroid, and a set of one or more robot base mount points configured to connect the support structure with a base of the vacuum robot arm such that a rotational axis of a rotational joint in the base of the vacuum robot arm that connects the base with an arm segment of the vacuum robot arm is interposed between the first centroid and the second centroid. In such implementations, a first distance between the first centroid and the second centroid when viewed along the rotational axis may be at least 70% of a horizontal width of the horizontally elongate vacuum transfer module along the short axis of the horizontally elongate vacuum transfer module, and a second distance between the first centroid and the rotational axis when viewed along the rotational axis may, when the support structure is connected with the base of the vacuum robot arm, be at most 25% of the horizontal width of the vacuum transfer module along the short axis of the horizontally elongate vacuum transfer module.

In some implementations of the apparatus, the one or more vacuum transfer module mount points in the second set of vacuum transfer module mount points may be each at least 60% of the horizontal width of the horizontally elongate vacuum transfer module from a closest one of the one or more vacuum transfer module mount points in the first set of vacuum transfer module mount points, and there may be no vacuum transfer module mount points on the support structure in between the one or more vacuum transfer module mount points in the first set of vacuum transfer module mount points and the one or more vacuum transfer module mount points in the second set of vacuum transfer module mount points.

In some implementations of the apparatus, the first distance may be at least 80% of a horizontal width of the vacuum transfer module along the short axis of the horizontally elongate vacuum transfer module. In some further implementations of the apparatus, the first distance may be at least 90% of a horizontal width of the vacuum transfer module along the short axis of the horizontally elongate vacuum transfer module.

In some implementations of the apparatus, the first distance may be at least 100% of a horizontal width of the vacuum transfer module along the short axis of the horizontally elongate vacuum transfer module.

In some implementations of the apparatus, the support structure may further include a compliance mechanism configured to permit relative displacement between the first centroid and the second centroid of at least 0.022 mm or more when the second set of one or more vacuum transfer module mount points are subjected to a load of less than 400 N directed towards the first centroid while the first set of one or more vacuum transfer module mount points is held fixed in place. In some such implementations of the apparatus, the compliance mechanism may include one or more items such as a) a linear bearing, b) a sliding bushing, c) a sliding contact interface, or d) a serpentine flexure following a serpentine path in the horizontal plane. In some further such implementations of the apparatus, the compliance mechanism may be located at least 80% or more of the first distance away from the first centroid and may be closer to the second centroid than the first centroid.

In some implementations of the apparatus, the apparatus may further include the base of the vacuum robot arm and a compliant vacuum-rated seal that has an inner mechanical mounting interface that is connected with the base of the vacuum robot arm. In some such implementations of the apparatus, the compliant vacuum-rated seal may include an axial bellows seal, a radial bellows seal, a flexible diaphragm seal, a flexible wavy diaphragm seal, or an elastomeric seal.

In some implementations of the apparatus, the apparatus may additionally include the horizontally elongate vacuum transfer module and the horizontally elongate vacuum transfer module may include a housing having a plurality of vertical side walls and having chamber interfaces located at different locations on the vertical side walls around the perimeter of the horizontally elongate vacuum transfer module. In such implementations, each chamber interface may be configured to connect with a corresponding component for receiving a semiconductor wafer, each chamber interface may include an opening sized to allow the semiconductor wafer to be passed through the vertical side wall on which the chamber interface is located, the housing may define the horizontal width of the horizontally elongate vacuum transfer chamber and a horizontal length of the horizontally elongate vacuum transfer chamber, the horizontal length may be at least twice as large as the horizontal width (or, in some particular instances, at least 1.25 times as large as the horizontal width), and the compliant vacuum-rated seal may have an outer mechanical mounting interface that is connected with the horizontally elongate vacuum transfer chamber.

In some such implementations of the apparatus, the vacuum transfer module mount points in the first set of one or more vacuum transfer module mount points may overlap with one of the vertical side walls when viewed along the rotational axis, and the vacuum transfer module mount points in the second set of one or more vacuum transfer module mount points may overlap with another one of the vertical side walls when viewed along the rotational axis.

In some implementations of the apparatus, the horizontally elongate vacuum transfer module may further include a vacuum robot arm mounting plate and the vacuum robot arm mounting plate may include mounting features that align with the first set of vacuum transfer module mount points and the second set of vacuum mount points. In such implementations, the support structure may be mounted to the vacuum robot arm mounting plate via the first set of vacuum transfer module mount points and the second set of vacuum mount points, and the vacuum robot arm mounting plate may be mounted to the housing.

In some implementations of the apparatus, the horizontally elongate vacuum transfer module may include at least two chamber interfaces along each of two longer vertical sidewalls.

In some implementations of the apparatus, the horizontally elongate vacuum transfer module may include a housing having a plurality of vertical side walls each having one or more chamber interfaces, each chamber interface may be configured to connect with a corresponding component for receiving a semiconductor wafer, each chamber interface may include an opening sized to allow the semiconductor wafer to be passed through the vertical side wall on which the chamber interface is located, and the one or more vacuum transfer module mount points in the first set of one or more vacuum transfer module mount points may be positioned so as to interface with mounting features located at an elevation that overlaps with at least one of the openings when viewed along a horizontal axis.

In some implementations of the apparatus, the horizontally elongate vacuum transfer module may include a vacuum robot arm that is configured to position wafers so as to lie in a common wafer transfer plane during wafer transfer operations, and the first centroid and the second centroid may be located so as to be proximate to or on the common wafer transfer plane when the support structure is connected with the horizontally elongate vacuum transfer module.

In some implementations of the apparatus, the support structure may be configured to not contact the horizontally elongate vacuum transfer module when installed except at locations proximate to the vacuum transfer module mount points.

In some implementations of the apparatus, the support structure may be a single, contiguous component. In some other implementations of the apparatus, the support structure may include multiple, separate components.

Other features, aspects, and advantages will become apparent from the description, the drawings, and the claims. Note that the relative dimensions of the following figures may not be drawn to scale.

BRIEF DESCRIPTION OF THE DRAWINGS

The various implementations disclosed herein are illustrated by way of example, and not by way of limitation, in the figures of the accompanying drawings, in which like reference numerals refer to similar elements.

The Figures depict only an example of the concepts discussed herein, and it will be readily appreciated that the concepts discussed herein may be implemented in a large number of alternate implementations, all of which are considered to be within the scope of this disclosure.

DETAILED DESCRIPTION

Importantly, the concepts discussed herein are not limited to any single aspect or implementation discussed herein, nor to any combinations and/or permutations of such aspects and/or implementations. Moreover, each of the aspects of the present invention, and/or implementations thereof, may be employed alone or in combination with one or more of the other aspects and/or implementations thereof. For the sake of brevity, many of those permutations and combinations will not be discussed and/or illustrated separately herein.

In a conventional, radially symmetric or arranged vacuum transfer chamber (VTM), the robot arm is centrally located so that the robot arm can generally use the same extension motions to reach each wafer processing station; such central mounting also permits the robot arm to rotate for a full 360° without colliding with anything.

Figure 1:
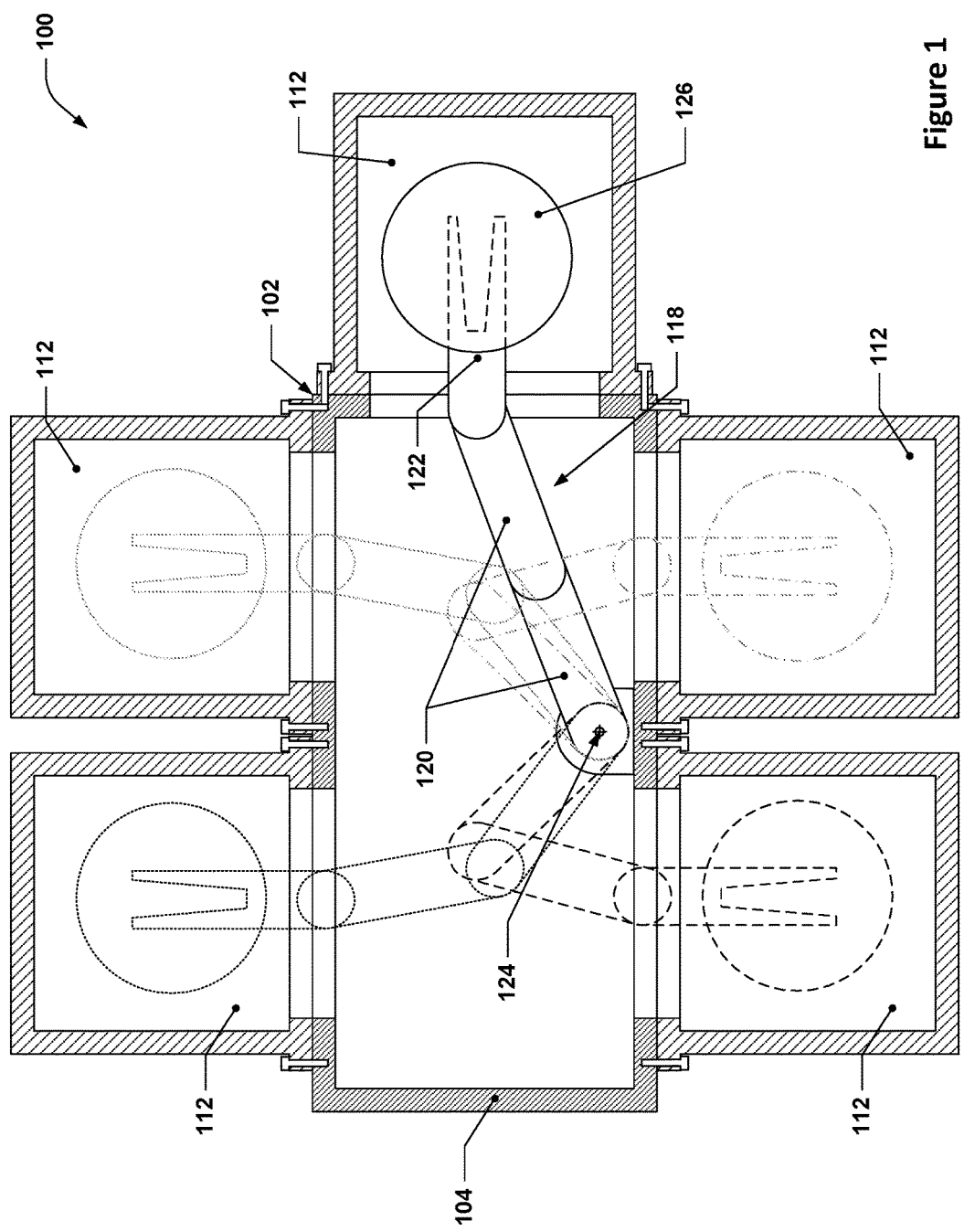
FIG. 1 depicts a plan view diagram of an example semiconductor processing tool with an example horizontally elongate vacuum transfer module.

The present inventors investigated departing from the radially symmetric or arranged VTM paradigm and began developing horizontally elongate VTMs, in which the VTM has a generally elongate, rectangular shape when viewed from above. For context, FIG. 1 depicts a plan view diagram of an example semiconductor processing tool with an example horizontally elongate vacuum transfer module. It will be understood that VTMs, as the term is used herein, may be unitary in construction, e.g., including a single-piece overall structure that generally defines the length, width, and height (but which may have other equipment, e.g., mounting plates, fixtures, support equipment mounted thereto to provide a fully functional VTM) or may be segmented in design, e.g., where two separate chamber pieces may be connected end-to-end to provide a VTM that is twice as long as each piece individually.

In FIG. 1, an apparatus 100, e.g., a semiconductor processing tool or portion thereof, is shown that has a set of five processing chambers 112 that are mated or mounted to a horizontally elongate VTM 102. The horizontally elongate VTM 102, in this example, is provided by a housing 104 that includes features, e.g., threaded holes to receive threaded fasteners, that allow the processing chambers 112 to be mounted thereto in a vacuum-tight manner. Openings sized sufficiently large enough for a wafer 126 to be passed through the sidewalls of the housing 104 and into the processing chambers 112 may be included in the housing to facilitate wafer transfer operations. While not shown, each processing chamber may also include a valve or door mechanism that allows such openings to be sealed off from the larger volume of the horizontally elongate VTM 102 to prevent contamination from or interference with the processing operations performed within.

A horizontally elongate VTM such as that shown in FIG. 1 may feature an off-center mounting location for a vacuum robot arm 118, which contrasts with the centered mounting location used for most radially symmetric or arranged VTMs. As shown in FIG. 1, the vacuum robot arm 118 is centered along the long axis of the horizontally elongate VTM 102, but is offset significantly from the centerline of the housing 104 along the short axis of the horizontally elongate VTM. In this particular case, the vacuum robot arm 118 has a robot arm base (not visible) that is mounted such that a shoulder joint of the vacuum robot arm 118 has a rotational axis 124 that is positioned such that the shoulder segment 120 of the vacuum robot arm 118 can only rotate slightly more than 180° before colliding with a side wall of the housing 104. The robot arm 118 may also include a forearm segment 120 and an end effector 122; other implementations may allow for additional arm segments and/or end effectors, or even additional vacuum robot arms. As can be seen from the dashed or dotted outlines in FIG. 1, the vacuum robot arm 118 may be moved between different positions to allow the end effector 122 to pick and/or place wafers from/into any of the attached processing chambers 112. The offset mounting of the vacuum robot arm 118 allows for the length of the arm segments to be increased while still allowing those arm segments to be rotated through 180° of arc without colliding with a sidewall of the housing 104; while shorter length arm segments could be used to allow the vacuum arm robot 118 to be mounted in a more central location, this would require additional segments and rotational joints in the arm to achieve the same overall reach achievable with an off-center mounted vacuum robot arm.

The present inventors determined that such off-center horizontally elongate VTM vacuum robot arm mounting in the context of a horizontally elongate VTM introduced a significant alignment issue. This issue is discussed below with reference to FIGS. 2 through 5.

Figure 2:
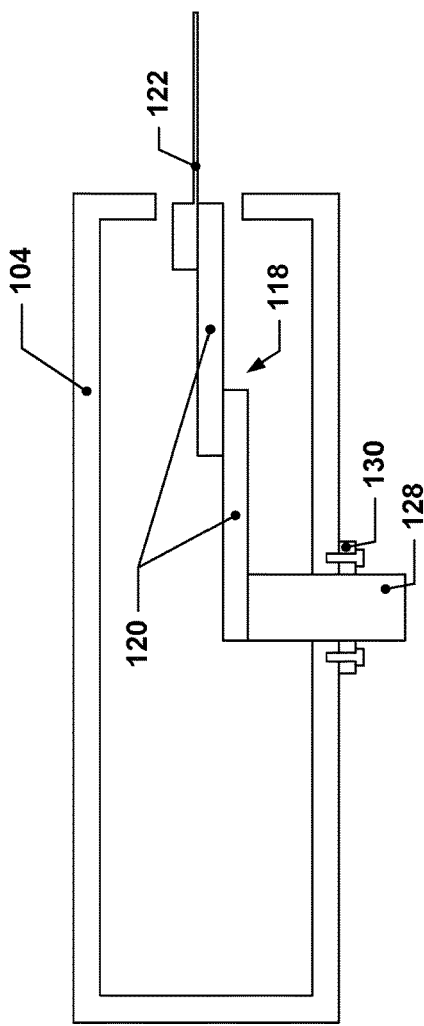
FIG. 2 depicts a side view diagram of the example vacuum robot arm and horizontally elongate vacuum transfer module of FIG. 1.
Figure 3:
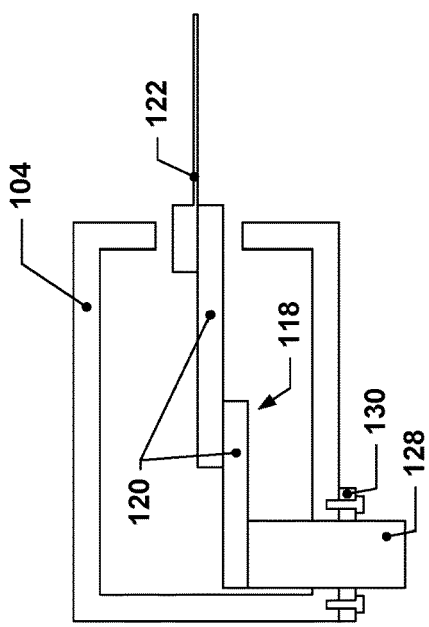
FIG. 3 depicts another side view diagram of the example vacuum robot arm and horizontally elongate vacuum transfer module of FIG. 1.
Figure 4:
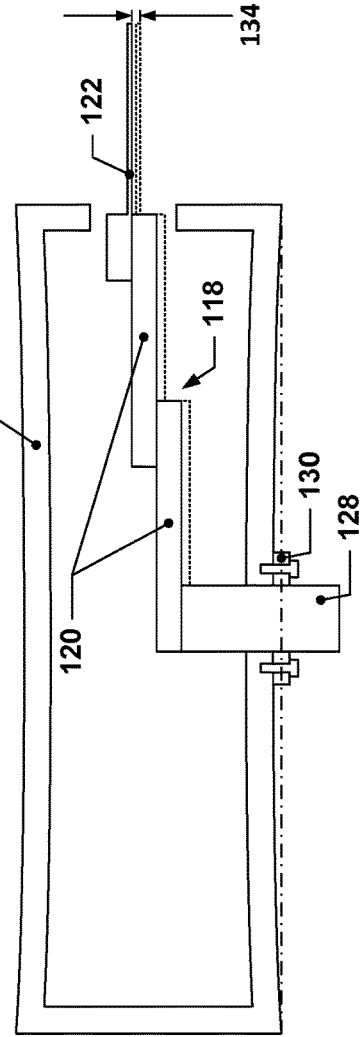
FIG. 4 depicts the side view diagram of FIG. 2 but with the vacuum transfer module supporting a vacuum environment within.

FIG. 2 depicts a side view diagram of the example vacuum robot arm and horizontally elongate vacuum transfer module of FIG. 1, e.g., as may be seen through sectioning plane A-A in FIG. 1 (FIG. 4 is from a similar perspective). FIG. 3 depicts another side view diagram of the example vacuum robot arm and horizontally elongate vacuum transfer module of FIG. 1, e.g., as may be seen through sectioning plane B-B in FIG. 1 (FIGS. 5-9 are shown from similar perspectives).

As can be seen in FIG. 2, the vacuum robot arm 118 is at full or near-full extension when accessing processing chambers located at the extreme ends of the example horizontally elongate vacuum transfer module 102. The vacuum robot arm 118 may be extended to a lesser degree when accessing process chambers 112 located along the longer sides of the example horizontally elongate vacuum transfer module 102, as shown in FIG. 3—although depending on the location of such process chambers 112 along the long axis of the example horizontally elongate vacuum transfer module 102, the amount of extension may still be comparable to the extension needed to reach the processing chambers 112 at the extreme ends of the example horizontally elongate vacuum transfer module 102.

In FIG. 3, the vacuum robot arm 118 is at a lesser degree of extension and is positioned so as to access a process chamber 112 located along a long side of the horizontally elongate vacuum transfer module 102.

Figure 5:
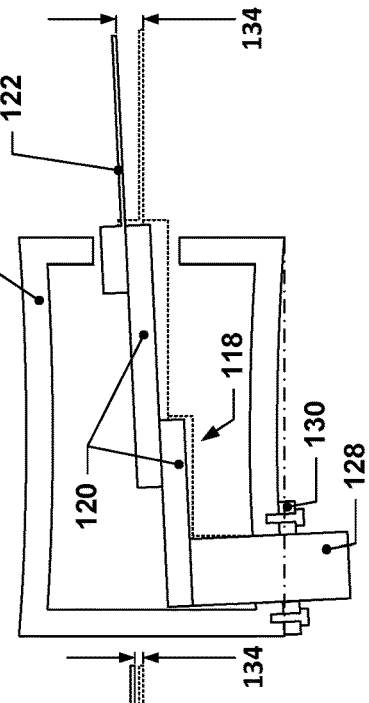
FIG. 5 depicts the side view diagram of FIG. 3 but with the example vacuum transfer module supporting a vacuum environment within.

VTMs are typically quite large, e.g., several feet in diameter, and have large, generally flat surfaces. When a VTM is pumped down to a vacuum, the atmospheric pressure that is exerted on the external surfaces of the VTM causes the VTM floor, ceiling, and sidewalls to deflect; this is most evident in the floor and ceiling, as these are the largest surfaces and thus may see the largest loading/deflection, depending on the various wall thicknesses and overall geometry. FIGS. 4 and 5 show such deflection, although in exaggerated fashion and simplified so that only the floor and ceiling of the example horizontally elongate vacuum transfer module are shown as deflected (the side walls would deflect as well, but this is not depicted here).

In a radially or arranged symmetric VTM, as the floor of a radially symmetric or arranged VTM deflects due to atmospheric loading, a centrally mounted vacuum robot arm of such a VTM may translate vertically relative to the sidewalls of the VTM by an amount generally corresponding to the maximum deflection of the floor. However, due to the radial symmetry or arrangement of the VTM about the vacuum robot arm mount point, the vacuum robot arm may generally remain in its original orientation, i.e., the rotational axes of the vacuum robot arm may remain in the same orientations they were in prior to depressurization of the VTM. The end result is that the entire vacuum robot arm assembly may move upwards by the amount of the deflection—the end effector, regardless of where it is positioned, would be subject to the same displacement (although it will be noted that robot arms will, themselves, experience variable amounts of flexure depending on how far out they are extended—the further extended a robot arm is, the more the arm will bend under its own weight; this behavior is inherent in all robot arms, regardless of whether or not the robot arm is used in a vacuum environment).

Vacuum robot arms are typically "trained" after installation in a VTM. Training typically involves manually controlling a vacuum robot arm to move to various positions within the VTM and/or the processing chambers attached thereto and, through various inspection techniques, adjusting the positioning of the vacuum robot arm so that a wafer carried by the vacuum robot arm is positioned at the various positions desired during wafer transfer operations for normal wafer processing. From a practical standpoint, training of the vacuum robot arm is typically done at atmospheric conditions, as free access to the interior of the VTM and the process chambers is typically required in order to ensure that the vacuum robot arm is moving the wafer(s) to the proper locations.

Once the vacuum robot arm has been moved to be in a desired position, the vacuum robot arm may be instructed to "remember" (based on sensor data from internal positional sensors of the vacuum robot arm) that position as a "trained" position, allowing the vacuum robot arm to return to that exact same position later, e.g., during actual wafer processing. When a vacuum robot arm is vertically displaced by deflection of the floor, as may occur with centrally mounted vacuum robot arms in radially symmetric or arranged VTMs, the end effector's actual position at each trained location may be correspondingly displaced vertically by the same amount. Such displacement is typically small, e.g., on the order of a few thousandths of a millimeter (0.005 mm to 0.010 mm, for example), and may, in some instances, be small enough that it is ignored. In other instances, the entire vacuum robot arm assembly may be caused to move downwards, e.g., by activating a Z-axis drive mechanism, after depressurization of the VTM by an amount equal to the displacement, thereby effectively canceling out the effects of such displacement.

Horizontally elongate VTMs with off-center vacuum robot arm mounting locations, however, may experience both translation and rotation due to atmospheric loading of the horizontally elongate VTM. This is shown in exaggerated form in FIGS. 4 and 5. FIG. 4 depicts the side view diagram of FIG. 2 but with the example horizontally elongate vacuum transfer module supporting a vacuum environment within. FIG. 5 depicts the side view diagram of FIG. 3 but with the example horizontally elongate vacuum transfer module supporting a vacuum environment within.

As can be seen in FIG. 4, the vacuum robot arm 118 may experience translation along the vertical axis due to deflection of the floor of the housing 104 of the horizontally elongate VTM. Since the floor of the housing 104 in this view is generally symmetric about the vacuum robot arm 118 in this view, the bowing of the floor of the horizontally elongate VTM 102 may cause the vacuum robot arm 118 to translate vertically with little or no tilt to the left or right in this view, thereby causing the tip of the end effector to displace by an amount 134. In this respect, such movement is similar to that experienced by centrally mounted vacuum robot arms in radially symmetric or arranged VTMs. However, as can be seen in FIG. 5, due to the off-center mounting of the vacuum robot arm 118 along the short axis of the horizontally elongate VTM 102, the vacuum robot arm 118 may be caused to tilt due to the vacuum robot arm 118 being mounted to a surface of the housing 104 that has an average slope in the area where the vacuum robot arm 118 mounts that is non-horizontal. When a vacuum is drawn on the horizontally elongate VTM 102, the inward bulging of the floor causes the vacuum robot arm 118 to tilt due to its off-center mounting location. While this tilt may be quite small, e.g., on the order of hundredths of a degree, such rotational displacements can, when applied over the fully extended length of the vacuum robot arm 118, be magnified. For example, 0.05° of tilt to a vacuum robot arm with a 1.5 m reach may produce approximate 1.3 mm of vertical displacement 134 at the tip of the end effector as compared with the vacuum robot arm 118 in the same position but in an untilted state. Unlike the purely translational displacements experienced by a centrally located vacuum robot arm in a radially symmetric or arranged VTM, the displacements observed at the end of the end effector of an offset-mounted vacuum robot arm 118 may vary based on the degree of extension of the vacuum robot arm 118 and the rotational positioning of the vacuum robot arm 118.

For example, when the vacuum robot arm 118 is extended as shown in FIG. 4, the tilt applied to the base of the vacuum robot arm 118 may cause the vacuum robot arm 118 to, in effect, twist about its extension axis (which is parallel to the long axis of the horizontally elongate VTM in this view), which would cause a small amount of rotation in the wafer held by the vacuum robot arm 118, but which would generally not result in much, if any, vertical translation of the end effectors (for the 0.05° of tilt example mentioned above, the edges of a semiconductor wafer supported by such an end effector would effectively displace about 0.1 mm or so when the vacuum robot arm 118 is extended as in FIG. 4). As a result of this variation, it is not possible to, as discussed earlier, make a single, global adjustment to the trained locations or to the height of the vacuum robot arm 118 to compensate for such movements. Different amounts of vertical compensation would need to be applied for different sets of "trained" locations, depending on the positioning of the vacuum robot arm associated with those locations.

To address such issues, the present inventors conceived of a mounting system for vacuum robot arms that eschews the traditional direct-mount interface that is typically used to connect a vacuum arm robot to radially symmetric or arranged VTMs. In such a mounting system, the base of the vacuum arm robot may be connected with a support structure that spans across the underside of a horizontally elongate VTM and that, itself, connects with the horizontally elongate VTM at attachment points that are asymmetrically arranged relative to the base of the vacuum robot arm (or at least, relative to the rotational axis of a robot arm rotational joint within the base). In particular, the support structure may span across the area of the underside of the horizontally elongate VTM that experiences the most deflection and may first connect (in a structurally significant way) with the housing of the horizontally elongate VTM at a location that is on the opposite side of the point of maximum deflection of the underside of the horizontally elongate VTM from the base of the vacuum robot arm. This concept is explored further in the discussion below, which references additional figures.

Figure 6:
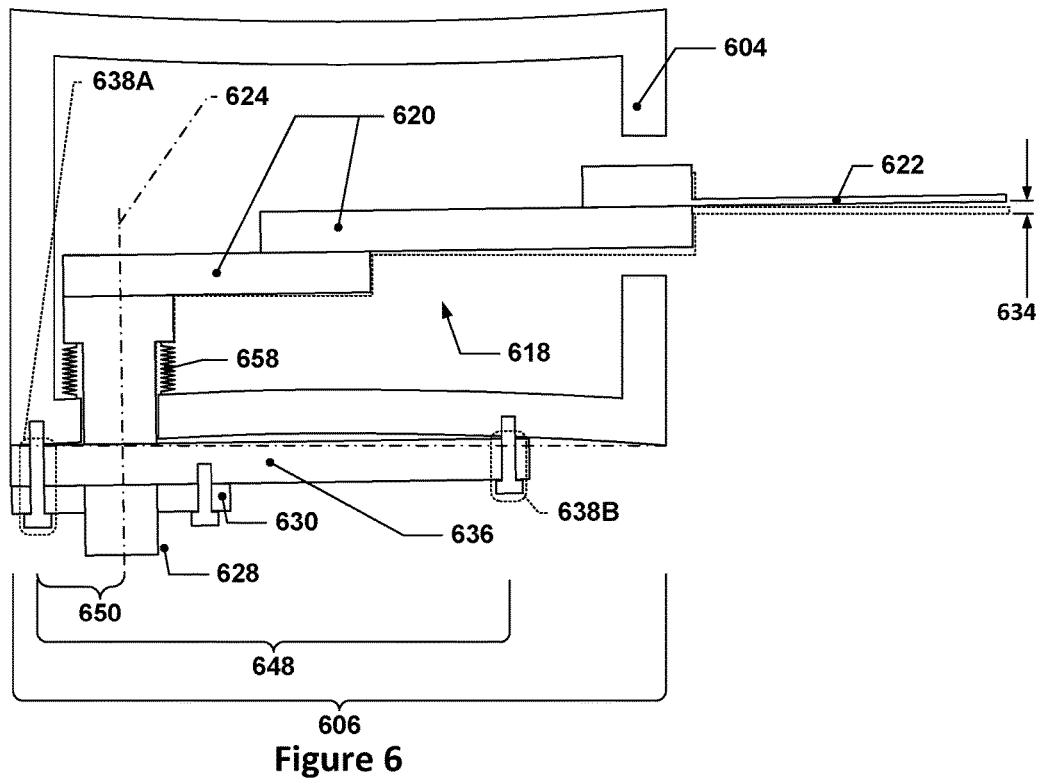
FIG. 6 depicts a side view diagram similar to that of FIG. 5 for an example horizontally elongate vacuum transfer module having an example implementation of a vacuum robot positioning system as disclosed herein.

FIG. 6 depicts a side view diagram similar to that of FIG. 5 for an example horizontally elongate vacuum transfer module having an example implementation of a vacuum robot positioning system as disclosed herein. In FIG. 6, a housing 604 of a horizontally elongate VTM is shown. A vacuum robot arm 618 having a robot arm base 628, two arm segments 620, and an end effector 622 is shown. The vacuum robot arm 618 is configured to rotate about a rotational axis 624 of a rotational joint within the robot arm base 628 and is mounted to a support structure 636 by way of a flange 630 or other type of fixed mounting interface.

The support structure 636 may, for example, be a single unitary piece or may be provided by multiple structures working in tandem, e.g., a pair of transverse beams. The support structure 636 may include vacuum transfer module mount points 638A (closer to the robot arm base 628) and 638B (further from the robot arm base 628), e.g., holes, quarter-turn camlocks for quick release hardware, or other types of connection features, that may be used to structurally connect the support structure 636 to the housing 604. In this case, the vacuum transfer module mount points 638A/B are through-holes through which screws are inserted and threaded into corresponding threaded holes on the housing 604. The vacuum transfer module mount points 638A/B may each define a first centroid and a second centroid, respectively. The first centroid, for example, corresponds with the average center of the vacuum transfer module mount points 638A, and the second centroid corresponds with the average center of the vacuum transfer module mount points 638B. If there is only one vacuum transfer module mount point 638A, then the first centroid would be coincident with that single vacuum transfer module mount point 638A; a similar observation may be made for the vacuum transfer module mount points 638B with respect to the second centroid.

Generally speaking, the first centroid and the second centroid may be spaced apart from one another by a first distance 648, which may be at least 70% of the horizontal width 606 of the housing 604. In some implementations, the first distance may be at least 80% or at least 90% of the horizontal width 606; in some further implementations, the first distance may actually be at least 100% of the horizontal width 606 (see, for example, the implementation discussed with reference to FIG. 16). Similarly, the first centroid and the axis of rotation 624 may generally be spaced apart by a second distance 650, which may be at most 25% of the horizontal width 606 of the housing 604 or the horizontally elongate VTM 602. Alternatively, in some implementations, the axis of rotation 624 may simply be within 25% of the horizontal width 606 of the closest sidewall of the housing 604. In some implementations, the one or more vacuum transfer module mount points 138B may each be at least 60% of the horizontal width of the horizontally elongate vacuum transfer module away from a closest one of the one or more vacuum transfer module mount points 138A. For example, there may be multiple vacuum transfer module mount points associated with each of the first centroid and the second centroid, and some of the vacuum transfer module mount points for one of the centroids may be closer to the other centroid than the other vacuum transfer module mount points of that centroid—however, there may still be a gap of at least 60% of the horizontal width of the horizontally elongate vacuum transfer module in between the vacuum transfer module mount points associated with each centroid that are closest to the other centroid.

As shown in FIG. 6, the vacuum transfer module mount points 638B are located approximately midway between the middle of the horizontally elongate VTM and the right sidewall of the horizontally elongate VTM; such a configuration still results in some tilting of the rotational axis 624 when the housing 604 is depressurized, but the displacement 634 at the end effector is considerably reduced as compared with the displacement shown in FIG. 5 (for the same amount of deformation in the housing 604).

In some implementations, a flexible vacuum-rated seal 658 or other similar mechanism for providing a vacuum-tight seal while permitting for slight angular displacements and/or linear displacements between the vacuum robot arm 618 and the housing 604 may be used to seal the gap between the housing 604 and the robot arm base 628 in a manner that permits the floor of the housing 604 to deflect while the robot arm base 628 remains stationary. In many implementations, the support structure 636 and the robot arm base 628 may be free of any structural connections to the housing except at the vacuum transfer module mount points 638A/B (it will be understood that "structural connections" here refers to connections that are intended to provide rigid structural support to the robot arm base 628, i.e., the vacuum-rated seal 658 would not be viewed as a structural connection since it is not designed to, or intended to, provide rigid structural support).

Figure 7:
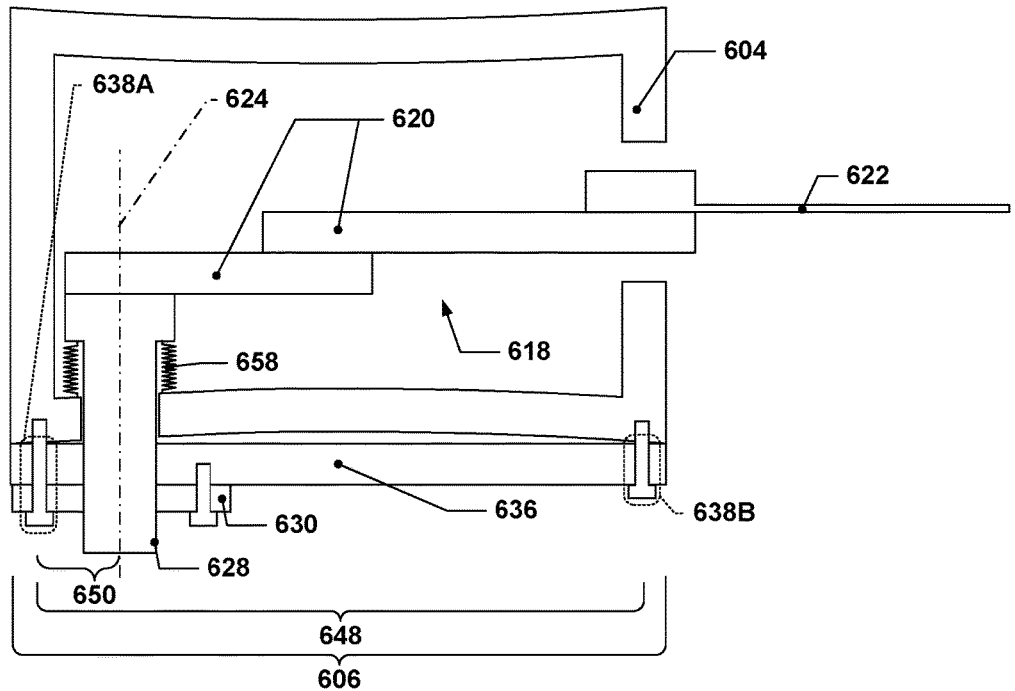
FIG. 7 depicts a side view diagram similar to that of FIG. 6 for an example horizontally elongate vacuum transfer module having another example implementation of a vacuum robot positioning system as disclosed herein.

FIG. 7 depicts a side view diagram similar to that of FIG. 6 for an example horizontally elongate vacuum transfer module having another example implementation of a vacuum robot positioning system as disclosed herein. In this example, the support structure 636 is longer and the vacuum transfer module mount points 638A and 638B are located at locations that overlap with the sidewalls of the housing 604 when viewed along the rotational axis 624. In such a configuration, there will no or almost no angular tilt caused by the deflection of the housing 604, virtually eliminating or completely eliminating vertical displacement of the end effector 622 due to rotation or translation.

Figure 8:
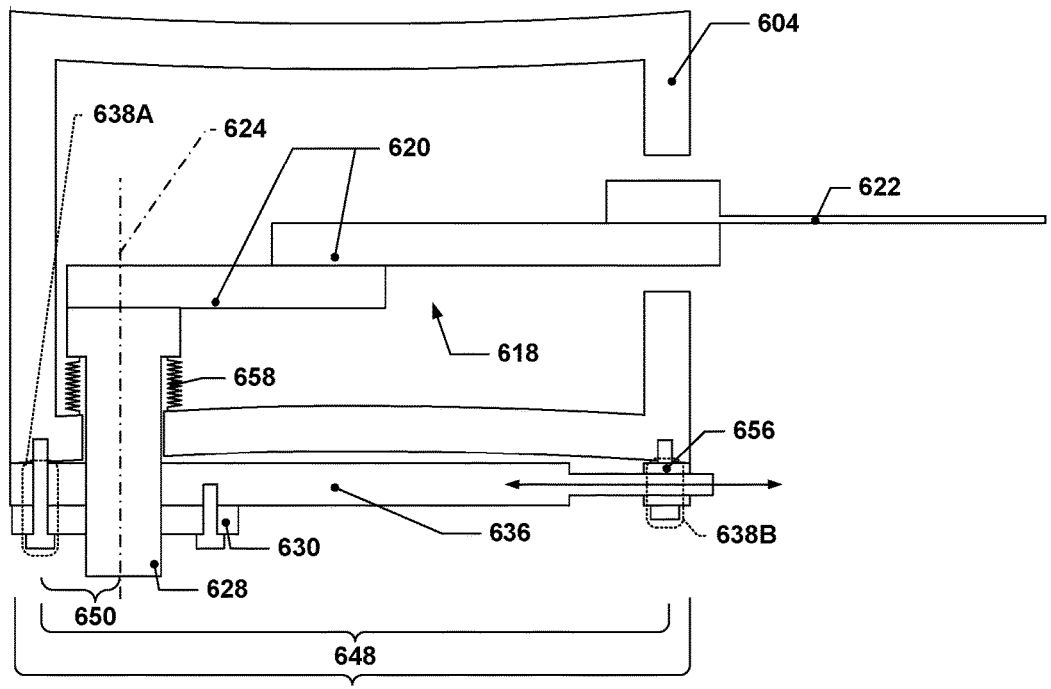
FIG. 8 depicts a side view diagram similar to that of FIG. 7, but with another example implementation of a vacuum robot positioning system as disclosed herein.

In some implementations, the support structure 636 may be further configured or equipped to provide a compliance mechanism that may permit the first and second centroids to be moved relative to one another by at least a small amount, e.g., a few millimeters, when subjected to a load of less than 400 N directed towards each other. For example, FIG. 8 depicts a side view diagram similar to that of FIG. 7, but with an example implementation of a vacuum robot positioning system having a compliance mechanism. In FIG. 8, the support structure 636 may include a linear bearing 656 or other linear translation mechanism, e.g., a bushing, linkage, or other mechanical system allowing the remainder of the support structure 636 to slide relative to the linear translation mechanism, located at the vacuum transfer module mount points 638B. Such implementations may additionally shield the vacuum robot arm 618 from displacements of the housing 604. For example, when subjected to a vacuum, the floor and ceiling of the housing 604 may bulge inwards, towards each other, causing the edges of the floor and ceiling to contract inwards slightly. This inward displacement may, in turn, cause the support structure 636 to enter a state of compression along the short axis of the housing, which may cause flexing or buckling behavior in the support structure 636; such movements may cause the vacuum robot arm 618 to unpredictably displace, which may defeat the purpose of the support structure 636.

Figure 9:
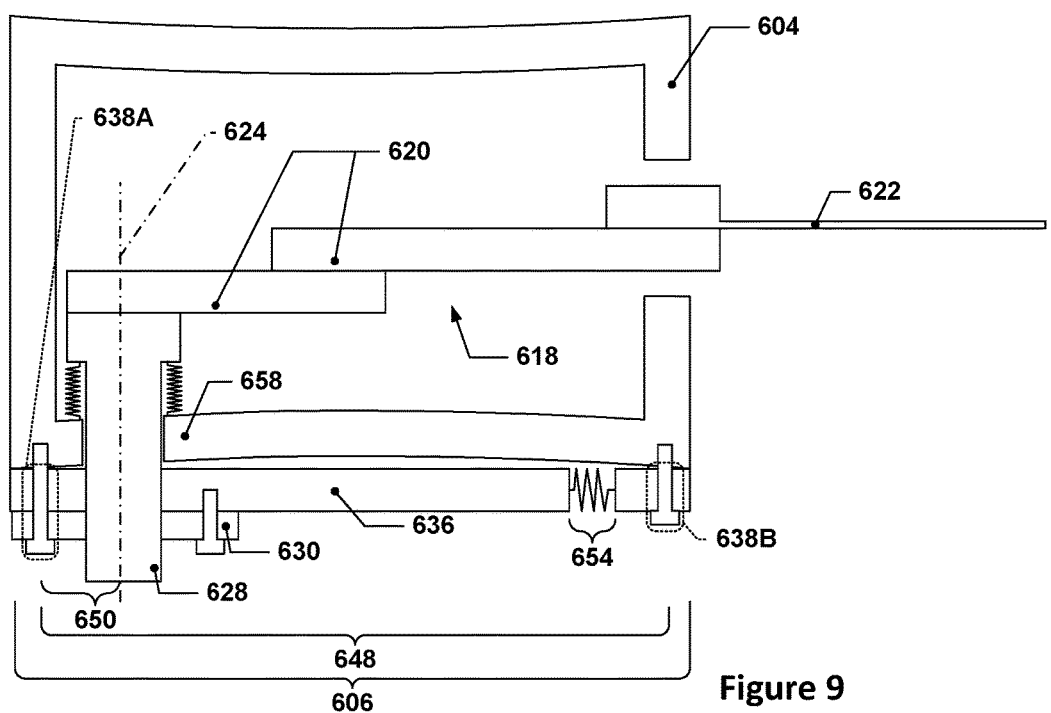
FIG. 9 depicts a side view diagram similar to that of FIG. 7, but with yet another example implementation of a vacuum robot positioning system as disclosed herein.

FIG. 9 depicts a side view diagram similar to that of FIG. 7, but with an example implementation of a vacuum robot positioning system having another example compliance mechanism. In FIG. 9, the compliance mechanism is provided in the form of a linear spring or springs, e.g., a serpentine flexure, that drastically reduces the compressive stiffness of the support structure 636 along the axis between the first centroid and the second centroid while still providing significant bending stiffness to the support structure 636 with respect to bending in the plane of the Figure. In such an implementation, the slight compressive displacement that may be exerted on the support structure 636 by the housing 604 may be easily absorbed by the compliance mechanism without generating significant displacement of the robot arm base 628. While such compliance mechanisms may additionally or alternatively be located at other locations along the support structure, locating such mechanisms close to, or collocated with, the vacuum transfer module mount points 638B may provide for more effective isolation of the robot arm base 628 from the deformations of the housing 604. For example, the compliance mechanism 654 may be located at least 80% or more of the first distance 606 away from the first centroid.

It will be noted that a common fastener is used in the implementations of FIG. 6 through 9 to fasten the robot arm base 628 to the support structure 636 and the support structure 636 to the housing 604; it will be understood that such a common mount may not be used in some implementations, and that the two mounting systems may use separate fasteners.

A more detailed example of such a robot arm mounting system is discussed below with reference to FIGS. 10 through 14.

Figure 10:
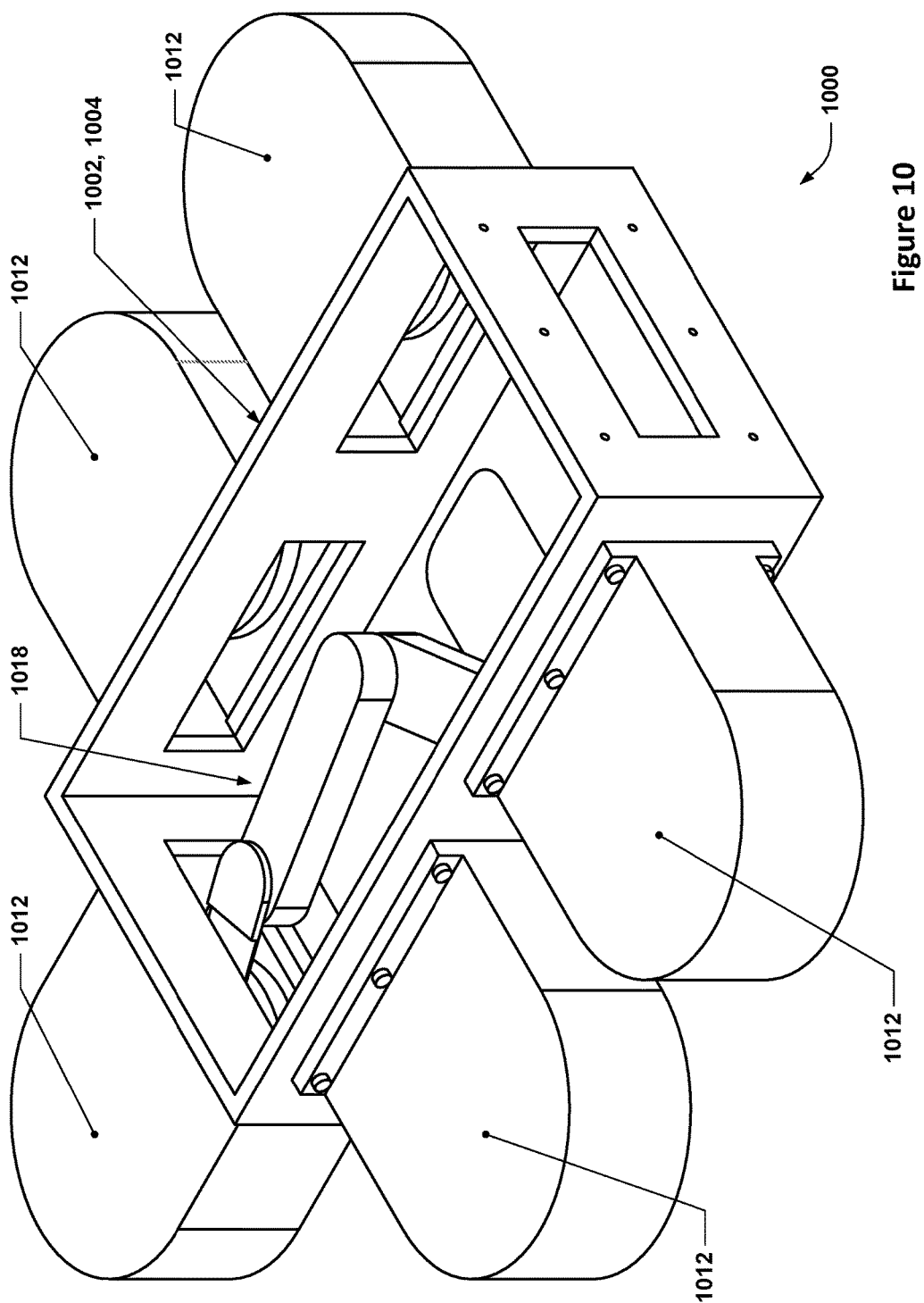
FIG. 10 depicts an isometric view of an example implementation of a vacuum transfer module and attached processing chambers.
Figure 11:
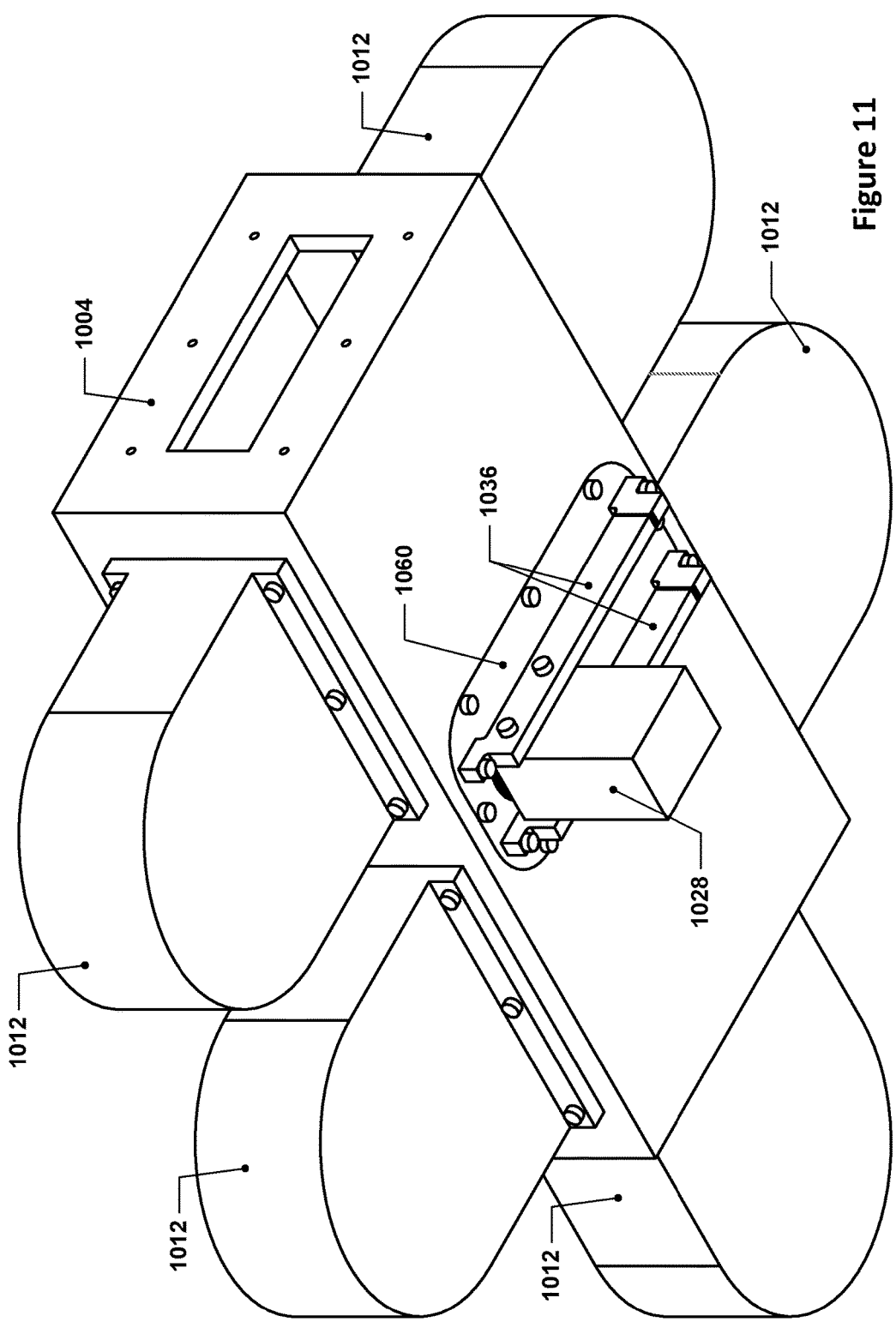
FIG. 11 depicts another isometric view of the example implementation of the vacuum transfer module and attached processing chambers of FIG. 10.

FIG. 10 depicts an isometric view of an example implementation of a vacuum transfer module and attached processing chambers. FIG. 11 depicts another isometric view of the example implementation of the vacuum transfer module and attached processing chambers of FIG. 10. In FIGS. 10 and 11, an apparatus 1000 includes a horizontally elongate VTM 1002 having a housing 1004. In this example, two process chambers 1012 are mounted to either long sidewall of the housing 1004, with a fifth process chamber 1012 mounted to one of the short sidewalls at the end of the housing 1004. Generally speaking, a horizontally elongate VTM will have a length that is at least twice as long as the width; in some implementations of horizontally elongate VTMs, however, the length may be at least 1.25 times the width. A vacuum robot arm 1018 is mounted within the housing 1004. In this particular example, the housing 1004 includes a plate 1060 that forms part of the floor of the housing 1004; removing the plate 1060 allows the entire vacuum arm robot to be removed from the horizontally elongate VTM 1002. The vacuum robot arm 1018, in this example, has a robot arm base 1028 that is affixed to a support structure 1036 that includes two beams; each beam attaches to the robot arm base 1028 and also fastens to the plate 1060. It will be understood that the beams of the support structure 1036 may, in some implementations, connect directly to a fixed portion of the housing 1004, rather than to a removable portion of the housing 1004, e.g., the plate 1060. In other implementations, the housing 1004 may not include a removable plate 1060, and the plate 1060 may be subsumed into the housing 1004. For clarity, the roof of the housing 1004 or the horizontally elongate VTM 1002 is not shown in these Figures to avoid obscuring various internal features; similarly, there is an additional interface for mounting another process chamber or, alternatively, a load lock or other piece of equipment that is shown without that piece of equipment mounted. In practice, such openings in the housing 1004 would be sealed in order to provide a hermetic environment suitable for supporting a vacuum environment.

Figure 12:
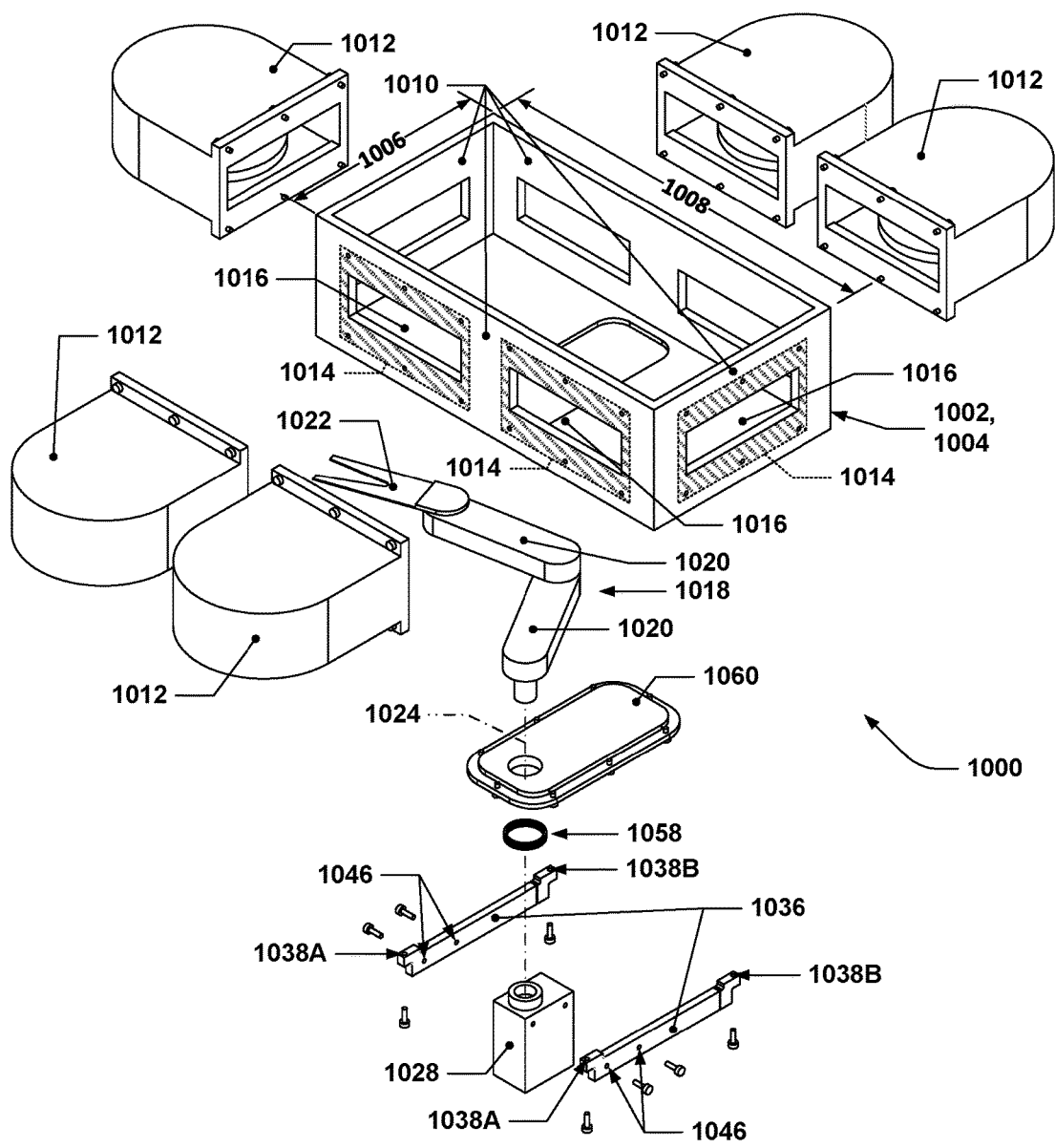
FIG. 12 depicts an exploded isometric view of the example implementation of the vacuum transfer module and attached processing chambers of FIG. 10.

FIG. 12 depicts an exploded isometric view of the example implementation of the vacuum transfer module and attached processing chambers of FIG. 10. As can be seen in FIG. 12, the apparatus 1000 includes a housing 1004 that provides the bulk of the horizontally elongate VTM 1002. The housing 1004 may have a plurality of vertical sidewalls 1010 that each includes one or more chamber interfaces 1014 that include features for mounting a corresponding one of the process chambers 1012 thereto. Each chamber interface 1014 may include an opening 1016 that is sized to allow a wafer to be passed therethrough during transfer operations by the vacuum robot arm 1018. The housing 1004 may have a nominal horizontal length 1008 and a nominal horizontal width 1006, which may be generally defined by planes that are coincident with the contact surfaces between the housing 1004 and the process chambers 1012 or the like.

The support structure 1036, in this example, includes two beams that each include a vacuum transfer module mount point 1038B at the end furthest from the robot arm base 1028 and a vacuum transfer module mount point 1038A at the end closest to the robot arm base 1028. Of course, the support structure 1036 may also extend beyond the vacuum transfer module mount points, if desired, without affecting the functionality provided thereby.

The support structure 1036 in this example also includes robot base mount points 1046, which are through-holes in each beam that line up with threaded holes on the robot arm base 1028; threaded fasteners, e.g., screws, may be inserted through the robot base mount points and into the threaded holes in the robot arm base 1028 to clamp the robot arm base 1028 to the beams of the support structure 1036. The beams of the support structure 1036 may then be clamped to the plate 1060 (or directly to the housing 1004) by screws inserted through the vacuum transfer module mount points 1038A/B. A compliant vacuum-rated seal 1058 may be installed between the robot arm base 1028 and the plate 1060 (or the housing 1004) to provide a flexible, yet vacuum-sealed, interface between these components.

The vacuum robot arm 1018 may be configured to have multiple rotational joints, including one in the robot arm base 1028 that provides for rotation of an arm segment 1020 that is closest to the robot arm base 1028. The vacuum robot arm 1018 may include one or more additional arm segments 1020, as well as one or more end effectors 1022, which may be configured to support a wafer during wafer handling operations using the vacuum robot arm.

Figure 13:
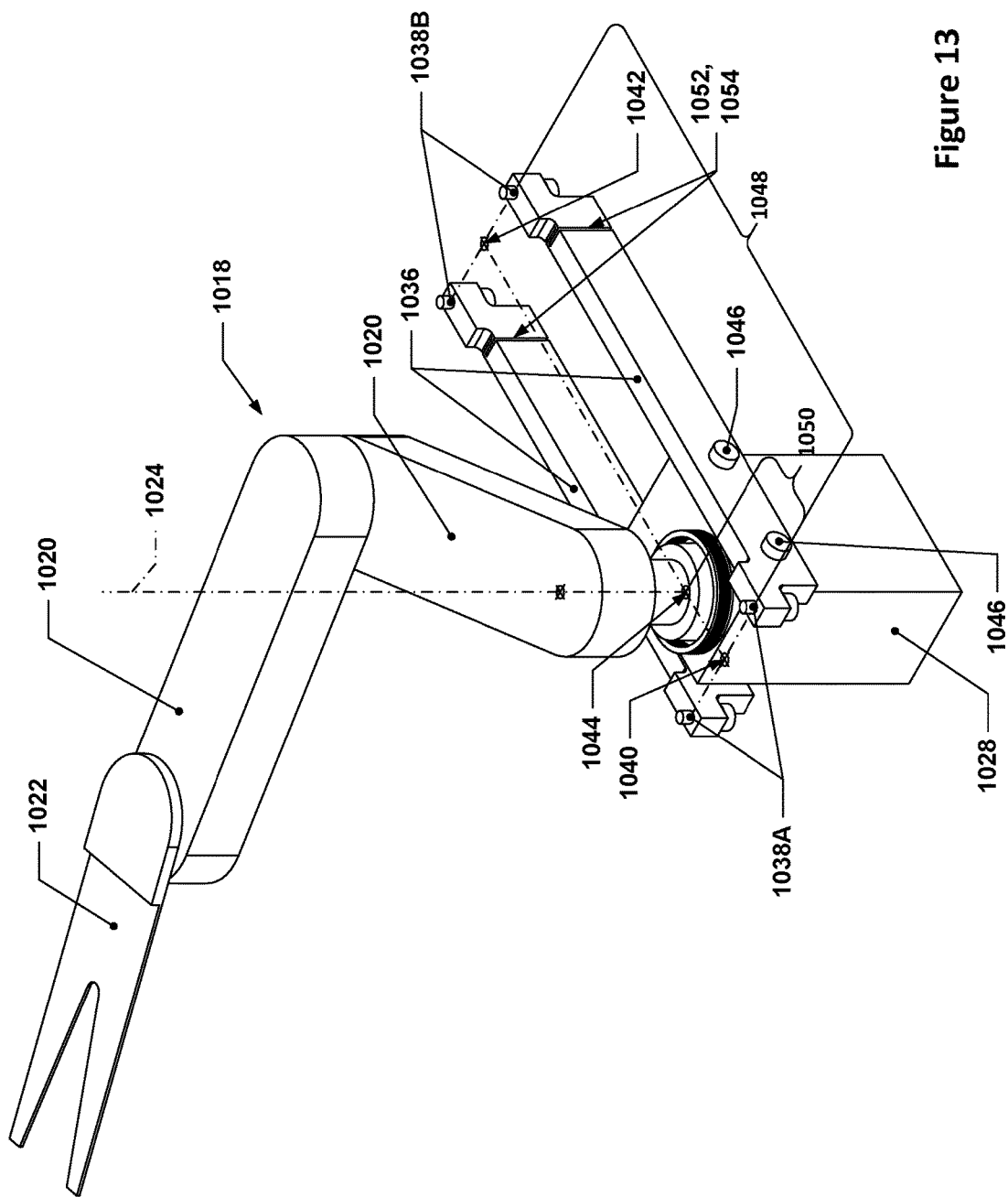
FIG. 13 depicts an isometric view of a subassembly of the example implementation of the vacuum transfer module and attached processing chambers of FIG. 10.

FIG. 13 depicts an isometric view of a subassembly of the example implementation of the vacuum transfer module and attached processing chambers of FIG. 10. The depicted subassembly includes the plate 1060, the vacuum arm robot 1018, the robot arm base 1028, and the support structure 1036. As is clear, the support structure 1036, in this example, is provided by two separate pieces that are connected together through their common attachment to the robot arm base 1028. Other implementations may feature a support structure 1036 that is unitary in nature, e.g., where the support structure 1036 is a single, contiguous part.

As discussed earlier, the vacuum transfer module mount points 1038A may define a first centroid 1040. In this case, there are two vacuum transfer module mount points 1038A, and the first centroid 1040 is located midway between them. Similarly, the vacuum transfer module mount points 1038B may define a second centroid 1042. The robot base mount points 1046 may similarly define a third centroid 1044—in this case, there are four robot base mount points 1046 (the two shown and two similar ones on the opposing side of the subassembly), and the third centroid 1044 is positioned in the middle of them, which happens to coincide with the rotational axis 1024. In other implementations, the third centroid may not align with the rotational axis 1024.

Figure 14:
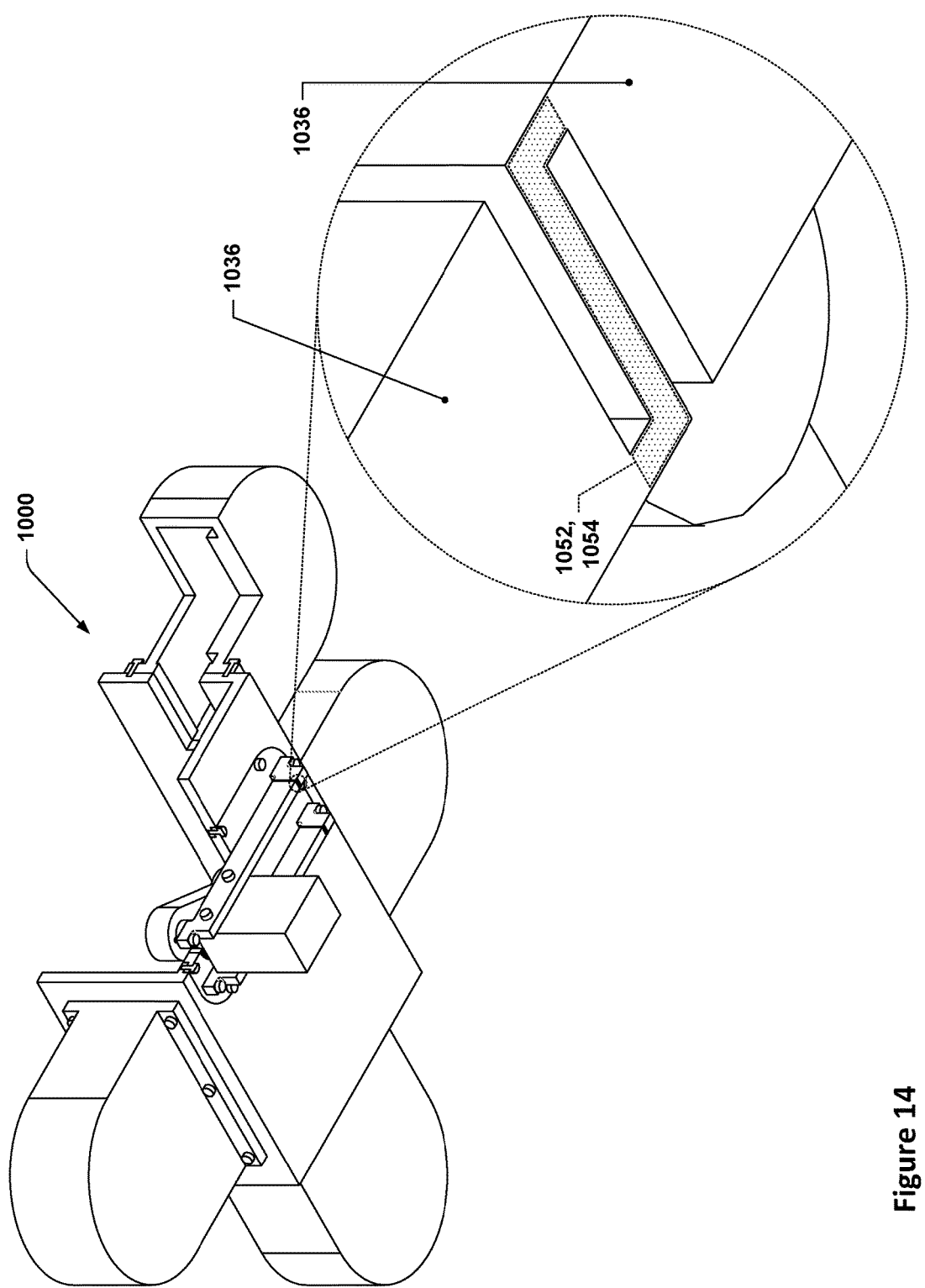
FIG. 14 depicts a detail view of an example compliance mechanism.

As discussed earlier, the first centroid 1040 and the second centroid 1042 may be located a first distance 1048 apart from one another; the first distance may be defined to be greater than or equal to about 70% of the horizontal width 1006. Additionally, the first centroid 1042 and the rotational axis 1024 may be located a second distance 1050 apart from one another; the second distance may be defined to be 25% or less of the horizontal width 1006. Also visible in FIG. 13 are the compliance mechanisms 1052, which, in this example, are provided by serpentine flexures 1054. FIG. 14 depicts a detail view of this example compliance mechanism. As can be seen in FIG. 14, each beam of the support structure 1036 includes a compliance mechanism 1052 that includes a serpentine flexure 1054 to allow for slight changes in distance between the first centroid 1040 and the second centroid 1042 without subjecting the support structure 1036 to high compressive loading.

Figure 15:
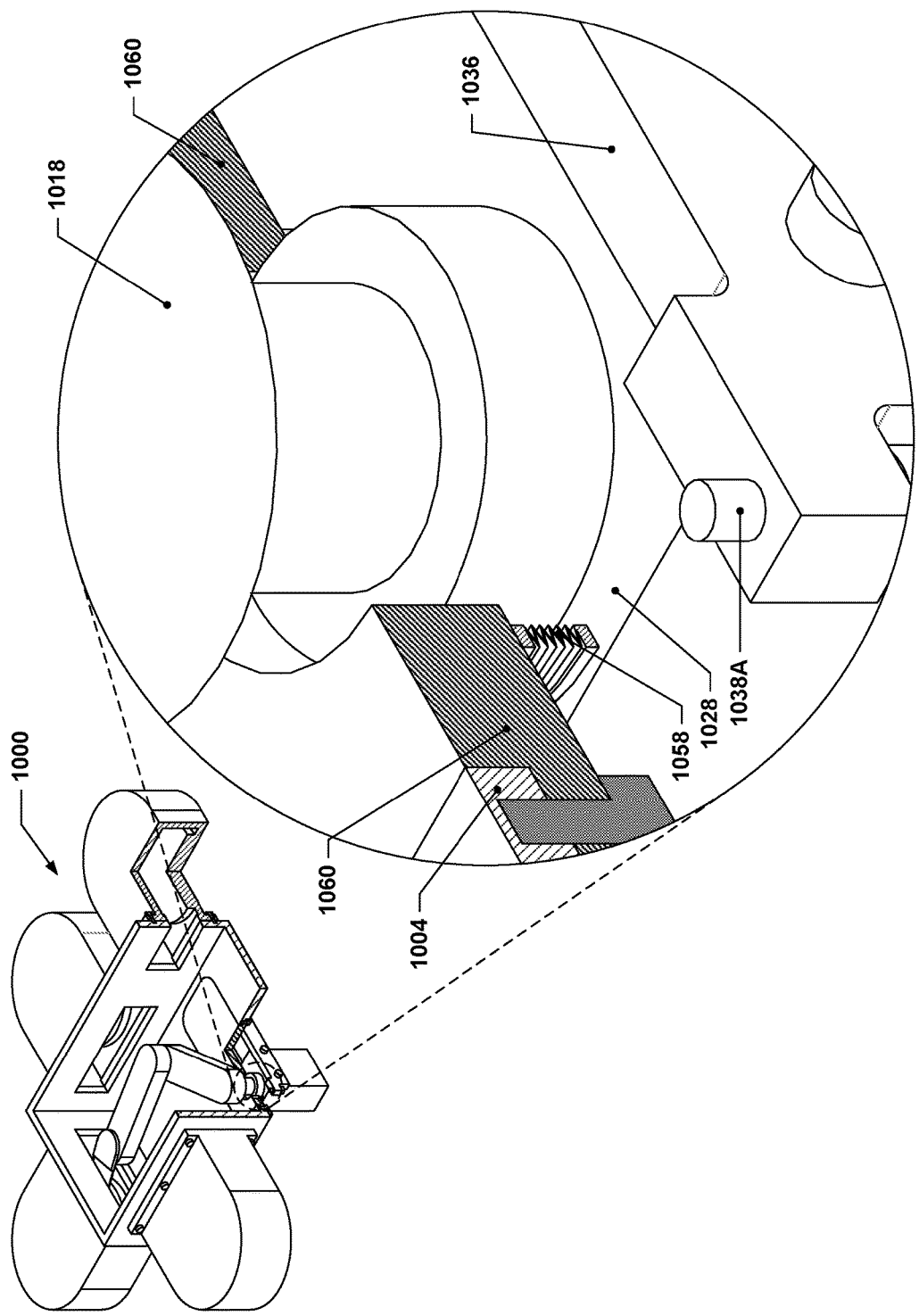
FIG. 15 depicts a detail view of an example compliant vacuum-rated seal.

FIG. 15 depicts a detail view of an example compliant vacuum-rated seal. As discussed earlier, the compliant vacuum rated seal 1058 may be installed between the robot arm base 1028 and the housing 1004 (or plate 1060) to provide a hermetic seal that permits small amounts of relative movement or misalignment between the robot arm base 1028 and the housing 1004 and/or plate 1060. In this example, the compliant vacuum-rated seal 1058 is a bellows-type seal, e.g., a circumferential axial bellows made, for example, of thin stainless steel or other suitable material. In the examples with bellows or other flexible seals shown herein, axial circumferential bellows are depicted since such bellows would also permit significant Z-axis movement, although it will be understood that any suitable flexible seal may be used, including radial bellows and flexible thin diaphragms, e.g., thin diaphragms with wavy radial cross sections, if little or no Z-axis movement need be accommodated by the seal.

In some implementations of such robot arm mounting systems, the support structure may have vacuum transfer module mount points that are configured to attach to features on the housing or the horizontally elongate VTM that are not located along the bottom surface of the horizontally elongate VTM, but along the exterior side walls of the housing or the horizontally elongate VTM. Such attachment points may, for example, be proximate to or coincident with a wafer transfer plane of the horizontally elongate VTM. The wafer transfer plane of a VTM refers to a reference plane that generally defines the plane of contact between the end effector(s) of the vacuum arm robot(s) of the VTM and the wafers that are placed on the end effector(s). For example, the pedestal that supports the wafer in each process chamber may be equipped with lift pins that are located underneath the wafer and are translated vertically to elevate the wafer off of the pedestal, allowing the end effector of the vacuum robot arm to be inserted underneath the wafer. The lift pins then retract, causing the wafer to rest on the end effector. The theoretical plane in which the wafer and end effector should come into contact is the wafer transfer plane; if there are misalignments in the system that cause the actual wafer transfer plane to deviate from the theoretical one, this can result in collisions between the wafer and the end effector, misalignments between the end effector and the wafer, or other undesirable side effects.

By positioning the vacuum transfer module mount points of the support structure such that they attach to features on the housing or the horizontally elongate VTM that are located proximate to or coincident with the wafer transfer plane, the support structure may even more effectively isolate the vacuum robot arm from deflections in the housing of the horizontally elongate VTM as compared with mounting systems described earlier herein.

Figure 16:
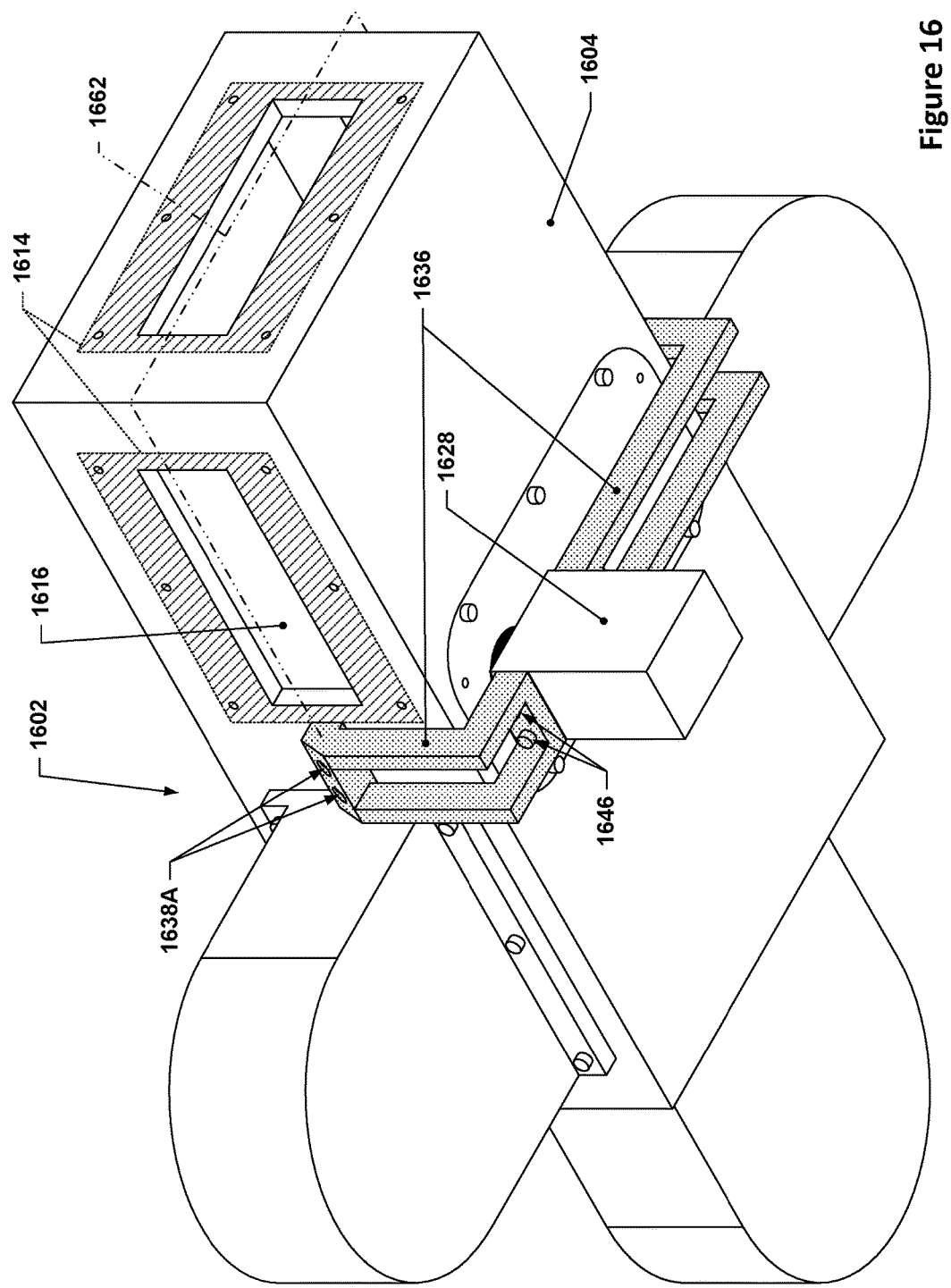
FIG. 16 depicts an isometric view of another example implementation of a vacuum transfer module and attached processing chambers.
Figure 17:
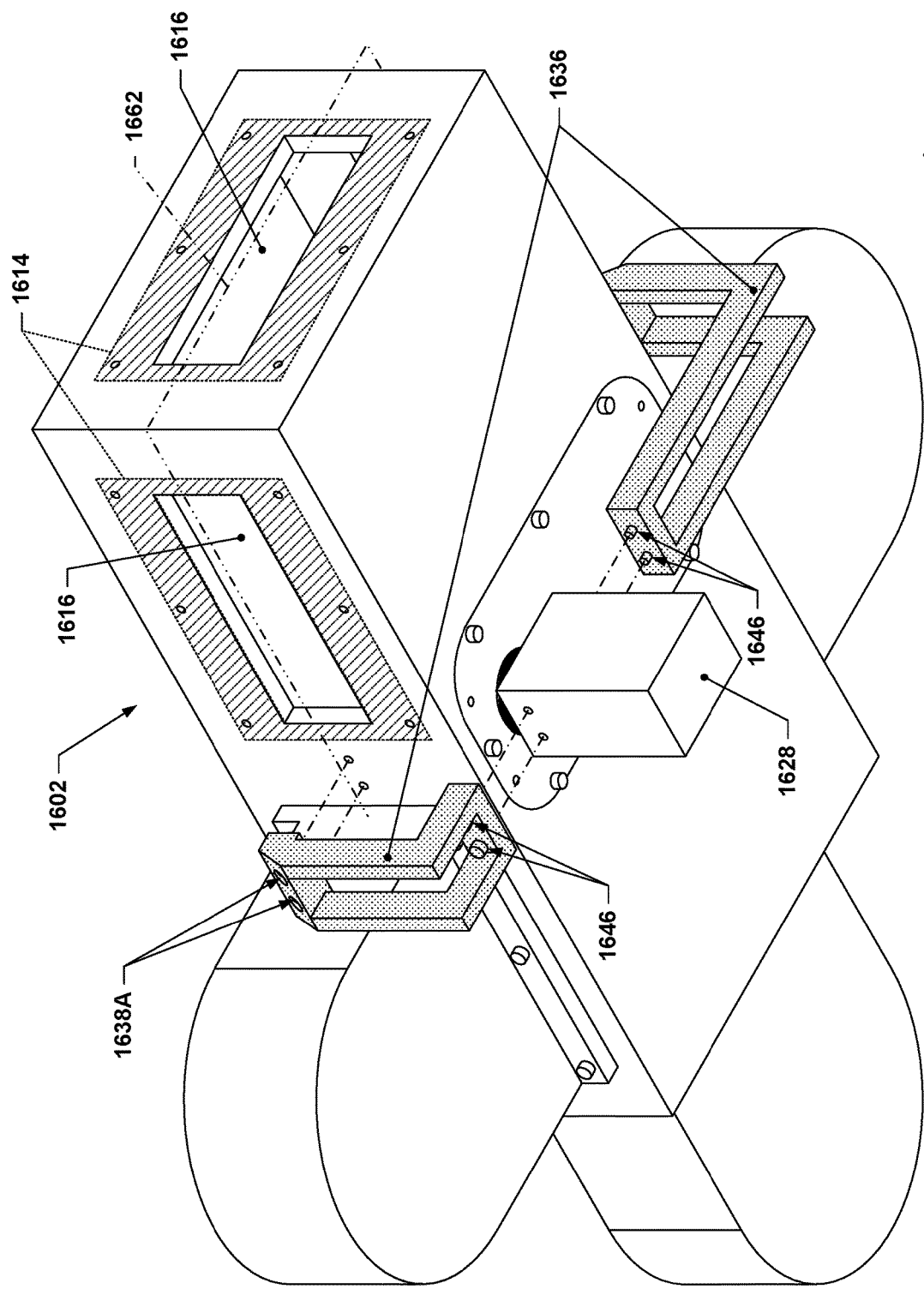
FIG. 17 depicts a partially exploded view of the example implementation of FIG. 16.

FIG. 16 depicts an isometric view of another example implementation of a vacuum transfer module and attached processing chambers. In FIG. 16, a horizontally elongate VTM 1602 is depicted; similar to the horizontally elongate VTM 1002 discussed earlier, the horizontally elongate VTM 1602 includes a housing 1604 with chamber interfaces 1614 that each include an opening 1616. For easy reference, the location of a wafer transfer plane 1662 is shown using dash-dot-dot lines. As can be seen, the horizontally elongate VTM 1602 includes a vacuum arm robot with a robot arm base 1628 which is supported by a support structure 1636 which is mounted to the housing 1604 by way of vacuum transfer module mount points 1638A and 1638B (not visible, but located on opposite side of the housing 1604) and to the robot arm base 1628 by way of robot base mount points 1646. FIG. 17 depicts a partially exploded view of the example implementation of FIG. 16.

Figure 18:
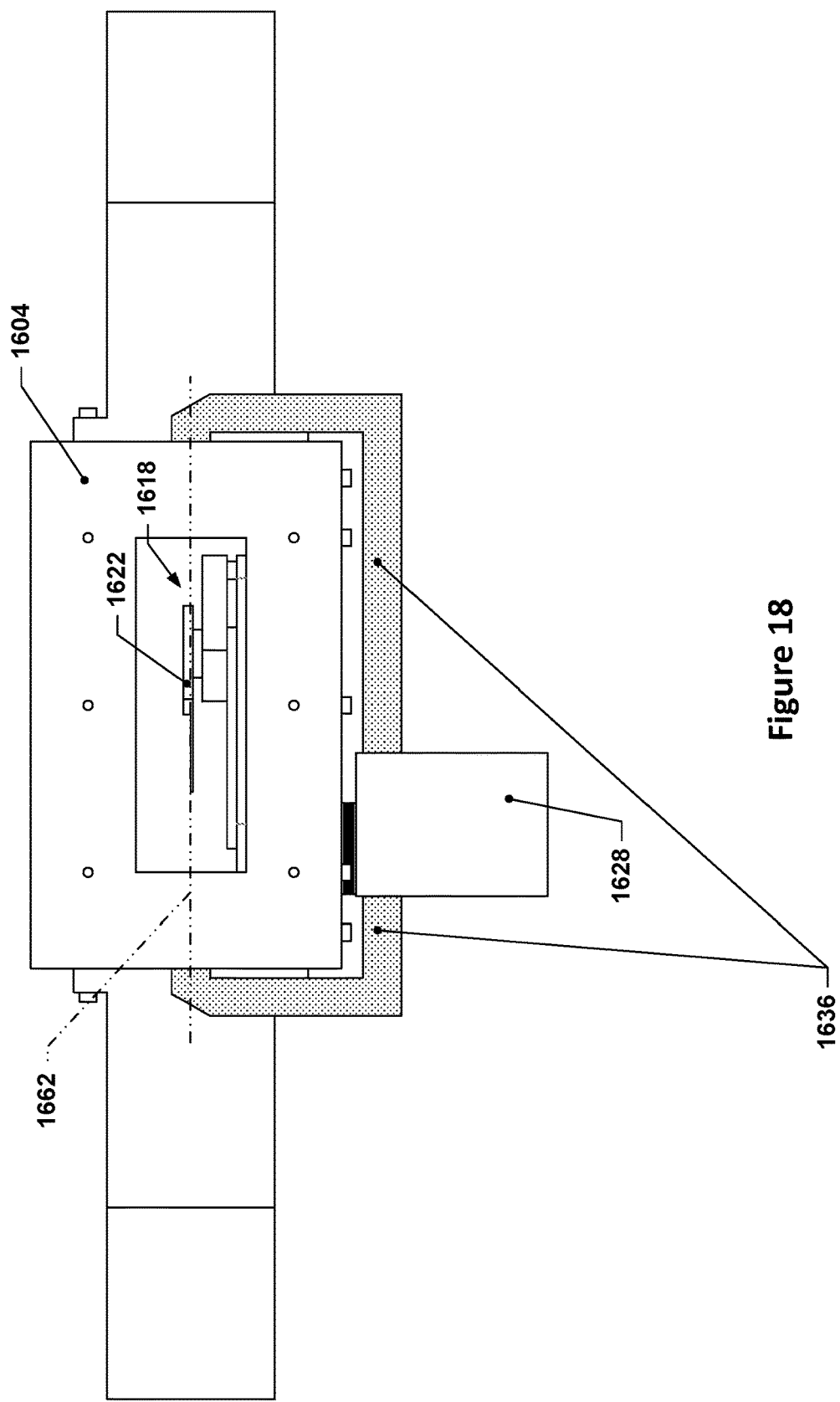
FIG. 18 depicts an end view of the example implementation of FIG. 16.

FIG. 18 depicts an end view of the example implementation of FIG. 16. As can be seen in FIG. 18, an end effector 1622 of the vacuum robot arm 1618 is located generally in-plane with the wafer transfer plane 1662. The vacuum transfer module mount points 1638A/B (not visible here, but their locations are evident from FIG. 16) connect the support structure 1636 with the housing 1604 at approximately the same level as the wafer transfer plane 1662.

It will be understood that other types of mounting structures embodying similar or related principles may be used in some instances as an alternative to the implementations discussed above. For example, the examples discussed above generally provide reduced or eliminated tilt due to VTM decompression by moving the vacuum transfer module mount points of the support structure towards the edges/sides of the VTM, e.g., away from the center of the VTM floor. However, in some implementations, an opposite approach may be taken, such as is shown in FIG. 19.

Figure 19:
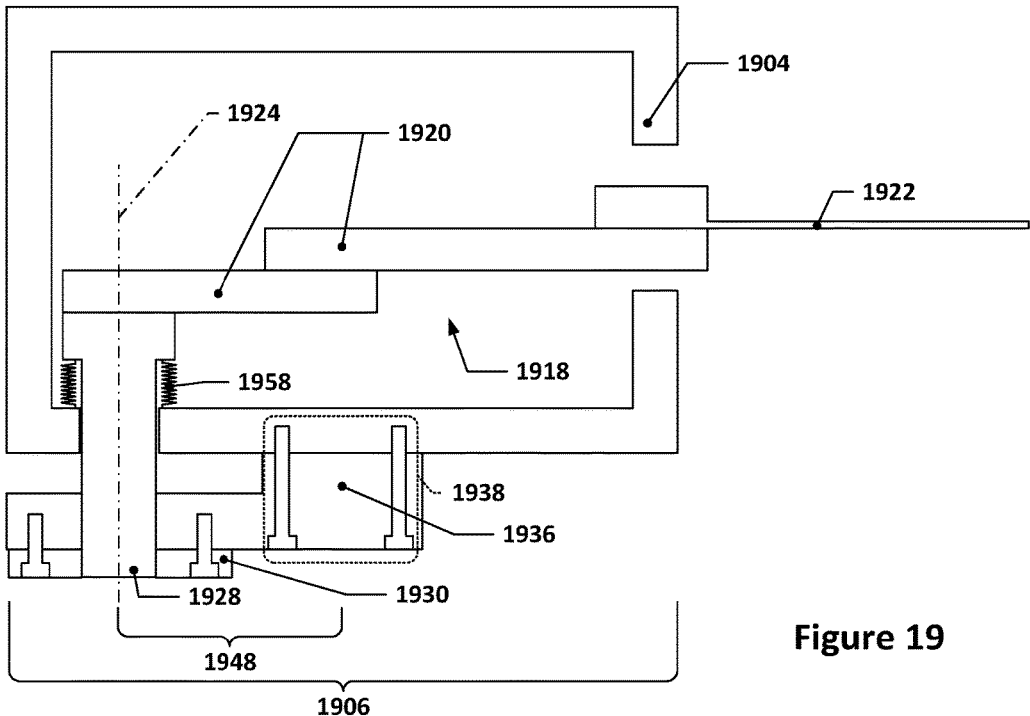
FIG. 19 depicts a diagram of a different example implementation of an example support structure for off-center mounting of a robot arm in a vacuum transfer module.

FIG. 19 depicts a diagram of a different example implementation of an example support structure for off-center mounting of a robot arm in a vacuum transfer module. In FIG. 19, a support structure 1936 is provided that is designed to attach to a housing 1904, e.g., a housing 1904 of a vacuum transfer module, near the center of the floor of the housing 1904. In this example, the support structure 1936 connects with the housing 1904 via a vacuum transfer module mount point 1938 (which includes multiple bolts, in this example), which is located near the center of the housing 1904. The support structure 1936 includes a cantilevered portion that extends between the center region of the housing 1904 where the vacuum transfer module mount point 1938 is located, and to robot arm base 1928, which is mounted to the support structure 1936 via a mounting flange 1930 in this example. The robot arm base 1928 may extend through an opening in the housing 1904 and support a vacuum robot arm 1918 that is housed within the housing 1904. The robot arm base 1928 may be sealed to the housing 1904 using a compliant vacuum-rated seal 1958, similar to other robot arm assemblies discussed herein.

Figure 20:
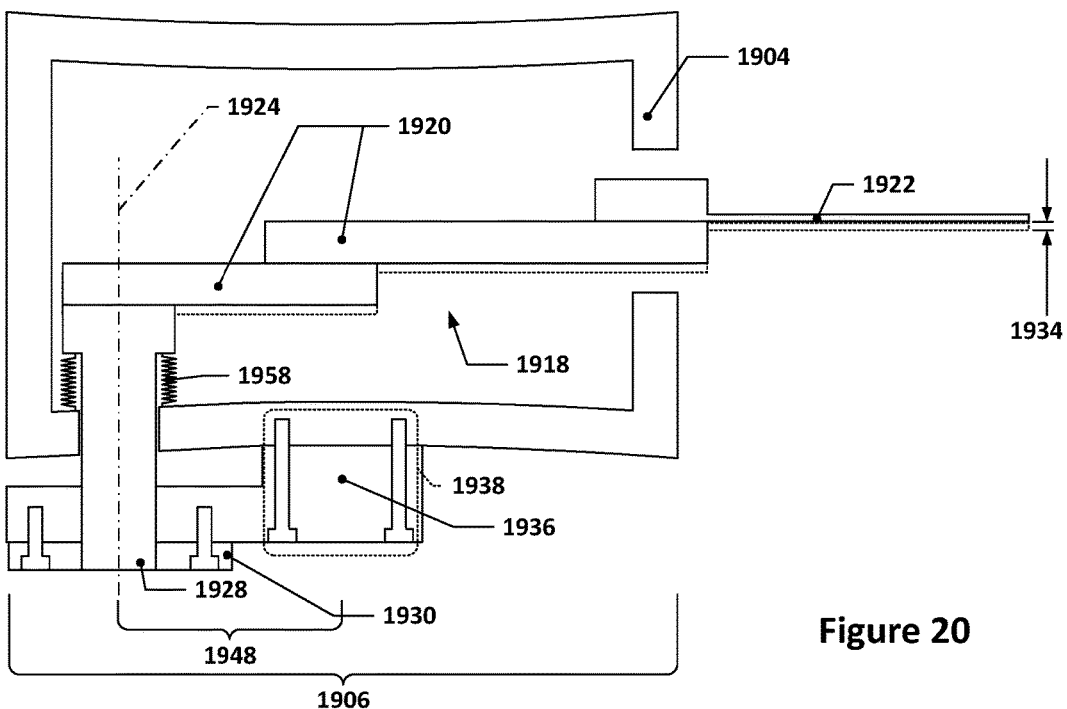
FIG. 20 depicts the example implementation of the example support structure of FIG. 19 but with the vacuum transfer module in a depressurized state.

FIG. 20 depicts the example implementation of the example support structure of FIG. 19 but with the vacuum transfer module in a depressurized state. Unlike in earlier examples discussed herein, the support structure 1936 of FIGS. 19 and 20 is not designed to appreciably reduce or eliminate z-axis displacement of the vacuum robot arm 1919 during depressurization of the housing 1904. However, by locating the vacuum transfer module mount point 1938 generally in the center of the bottom of the housing 1904, the deflection that the vacuum transfer module mount point 1938, and thus the support structure 1936 and the robot arm 1919 supported thereby, experiences is primarily constrained to vertical displacement with little or no angular displacement (as compared to vacuum transfer module mount points that may be located midway between the center of the housing 1904 and one of the edges of the housing 1904, for example). As a result, when the housing 1904 is depressurized and the floor of the housing 1904 bulges upwards, the robot arm 1918 may be caused to translate vertically by such deflection, e.g., by tip displacement 1934, but will generally not experience much or any tilt out of the XY (horizontal) plane. Due to the lack of, or very low, tilt that may be experienced, the amount of Z-axis displacement that may occur at end effector 1922 may be generally constant for the vacuum robot arm 1919 regardless of rotational position of the vacuum robot arm 1919 or the degree of extension thereof. Such generally constant vertical displacement may be within permissible limits of placement for a VTM system or may, for example, be easily corrected by applying a global Z-axis shift to positioning of the vacuum robot arm 1919 once the housing 1904 is depressurized, thereby cancelling out the relative displacement between the vacuum robot arm 1919 and the world coordinate frame.

In such implementations, the vacuum transfer module mount point 1938 may have a centroid (defined in a manner similar to that discussed above for the centroids discussed earlier) that is located a first distance 1948 from a rotational axis 1924 of the robot arm base 1928. The vacuum transfer module mount point 1938 may generally be centered on a horizontal width 1906 of the housing 1904, but may be located, in some implementations, within 10% of the horizontal width 1906 of the housing 1904 from the midpoint of the horizontal width 1906 of the housing 1904. Generally speaking, the vacuum transfer module mount point 1938 may be located on the floor of the housing 1904 at any location which sees the maximum amount of vertical displacement when the housing is depressurized—such locations may generally be within 10% of the middle of the horizontal width 1906 of the housing 1904, but may, depending on the geometry of the housing 1904, also be in other locations in some implementations. The first distance 1948 may generally be any distance that locates the robot arm base 1928 at some location between the vacuum transfer module mount point 1938 and a side wall of the housing 1904—for example, within 10% to 40% of the horizontal width 1906.

The techniques discussed herein may also be applied to non-elongate vacuum transfer modules, e.g., radially symmetric or arranged VTMs, to reduce or eliminate axial displacement of the robot arms within such modules relative to the world coordinate system.

Figure 21:
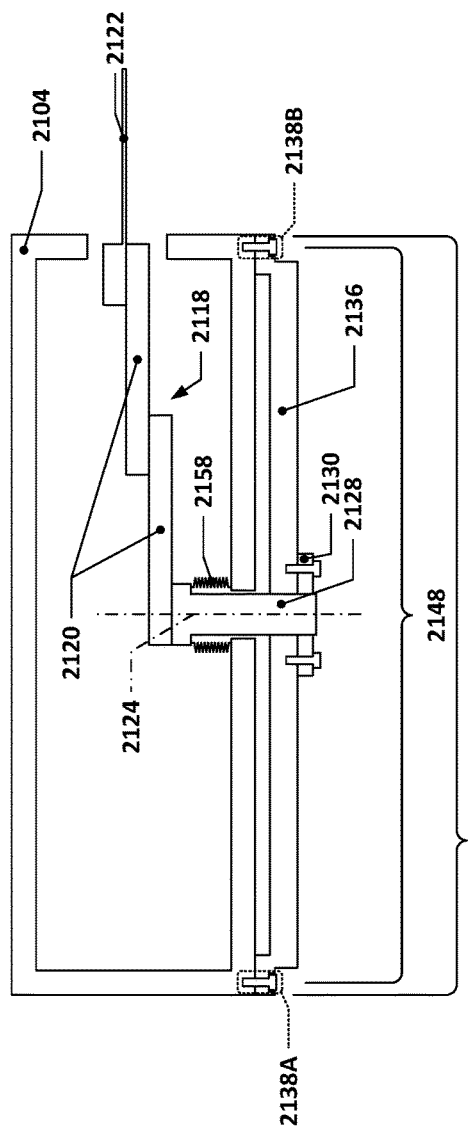
FIG. 21 depicts a diagram of a different example implementation of an example support structure for centered mounting of a robot arm in a radially arranged vacuum transfer module.

FIG. 21 depicts a diagram of a different example implementation of an example support structure for centered mounting of a robot arm in a radially arranged vacuum transfer module. In FIG. 21, a support structure 2136 has a first vacuum transfer module mount point 2138A and a second vacuum transfer module mount point 2138B that attach a support structure 2136 to a housing 2104, e.g., via bolts or screws. The support structure 2136 may be a beam or beam-like structure or structures, similar to ones discussed earlier herein, that may provide features that allow a robot arm base 2128 to be mounted thereto, e.g., via a mounting flange 2130. The robot arm base 2128 may be sealed to the housing 2104 using a a compliant vacuum-rated seal 2158, similar to other robot arm assemblies discussed herein, and may support a vacuum robot arm 2118 and end effector 2122.

The housing, in this example, may be a housing for a radially symmetric or arranged vacuum transfer module, and may generally appear to be square, pentagonal, hexagonal, heptagonal, octagonal, etc. when viewed along a rotation axis 2124 of the robot arm base 2128.

In this example, the support structure 2136 may be connected with the housing 2104 via vacuum transfer module mount points 2138A and 2138B that are positioned similarly as those discussed above with respect to elongate VTM implementations, except that instead of the placement of the vacuum transfer module mount points 2138A and 2138B being made relative to the horizontal width and the edges defining such horizontal width, the placement of the vacuum transfer module mount points 2138A and 2138B may be made relative to the horizontal widths of the housing 1904 in any plane that passes through the rotational axis 2124 and is perpendicular to one of the sides of the housing 1904 that is configured to mount to a process chamber, load lock, or other piece of equipment for receiving or providing wafers. For example, the vacuum transfer module mount point 2138A and 2138B may each have centroids that are within 10% or less or 20% or less of the horizontal width 2106 from the edges or sides of the housing 2104 defining the horizontal width 2106. In some implementations, the centroids of the vacuum transfer module mount points 2138A and/or 2138B may be located at locations beyond the horizontal width 2106, e.g., similar to the implementation of FIGS. 16 through 18. Unlike with off-center mounting of vacuum robot arms in elongate VTMs, on-center (or near-center, e.g., with rotational axes 2124 within 10% of the horizontal width 2106 from the midpoint of the horizontal width 2106) vacuum robot arms may be mounted so as to be centered, or nearly centered (e.g., within 10% of the first distance 2148 from the midpoint between the centroids of the vacuum transfer module mount points 2138 and 2138B) between the centroids of the vacuum transfer module mount points 2138 and 2138B.

Figure 22:
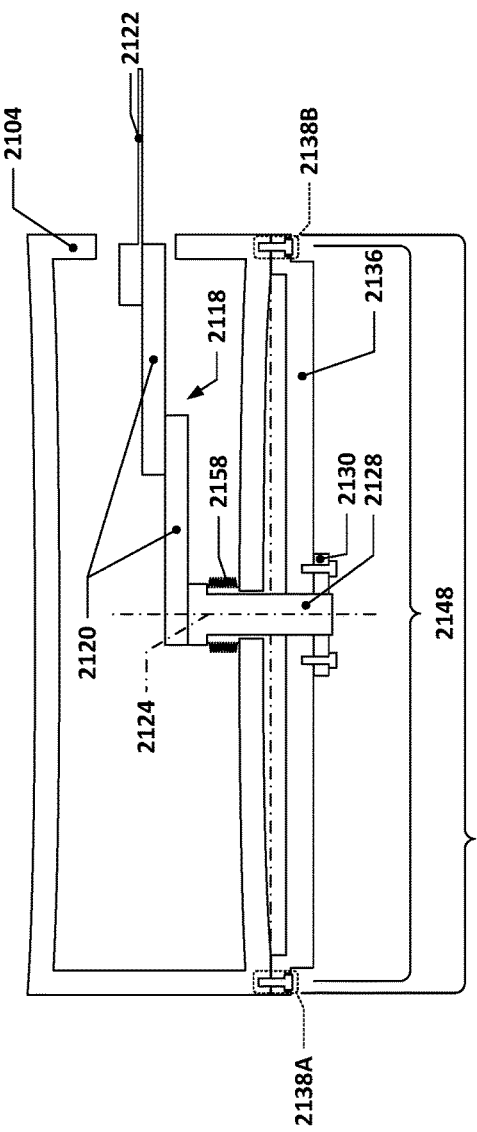
FIG. 22 depicts the example implementation of the example support structure of FIG. 21 but with the vacuum transfer module in a depressurized state.

FIG. 22 depicts the example implementation of the example support structure of FIG. 21 but with the vacuum transfer module in a depressurized state. When the housing 2104 is depressurized and deforms, the vacuum robot arm 2118 may experience reduced, or, in this example, zero, z-axis displacement relative to the world coordinate system, thereby eliminating or reducing the need for potential software correction of a z-axis offset after the vacuum robot arm has been "taught" at atmospheric conditions.

It is to be understood that the term "set," unless further qualified, refers to a set of one or more items—it does not require that multiple items be present unless there is further language that implies that it does. For example, a "set of two or more items" would be understood to have, at a minimum, two items in it. In contrast, a "set of one or more items" would be understood to potentially only have one item in it. In a similar vein, it is to be understood that the term "each" may be used herein to refer to each member of a set, even if the set only includes one member. The term "each" may also be used in the same manner with implied sets, e.g., situations in which the term set is not used but other language implies that there is a set. For example, "each item of the one or more items" is to be understood to be equivalent to "each item in the set of one or more items."

It is to be understood that the above disclosure, while focusing on a particular example implementation or implementations, is not limited to only the discussed example, but may also apply to similar variants and mechanisms as well, and such similar variants and mechanisms are also considered to be within the scope of this disclosure.

What is claimed is:

1. An apparatus comprising:
   a support structure for mounting a vacuum robot arm to a horizontally elongate vacuum transfer module for a semiconductor processing tool, the support structure including:
   a first set of one or more vacuum transfer module mount points collectively having a first centroid;
   a second set of one or more vacuum transfer module mount points collectively having a second centroid; and
   a set of one or more robot base mount points configured to connect the support structure with a base of the vacuum robot arm such that a rotational axis of a rotational joint in the base of the vacuum robot arm that connects the base with an arm segment of the vacuum robot arm is interposed between the first centroid and the second centroid, wherein:
      a first distance between the first centroid and the second centroid when viewed along the rotational axis is at least 70% of a horizontal width of the horizontally elongate vacuum transfer module along the short axis of the horizontally elongate vacuum transfer module, and
      a second distance between the first centroid and the rotational axis when viewed along the rotational axis is, when the support structure is connected with the base of the vacuum robot arm, at most 25% of the horizontal width of the vacuum transfer module along the short axis of the horizontally elongate vacuum transfer module.

2. The apparatus of claim 1, wherein:
   the one or more vacuum transfer module mount points in the second set of vacuum transfer module mount points are each at least 60% of the horizontal width of the horizontally elongate vacuum transfer module from a closest one of the one or more vacuum transfer module mount points in the first set of vacuum transfer module mount points, and
   there are no vacuum transfer module mount points on the support structure in between the one or more vacuum transfer module mount points in the first set of vacuum transfer module mount points and the one or more vacuum transfer module mount points in the second set of vacuum transfer module mount points.

3. The apparatus of claim 1, wherein the first distance is at least 80% of a horizontal width of the vacuum transfer module along the short axis of the horizontally elongate vacuum transfer module.

4. The apparatus of claim 1, wherein the first distance is at least 90% of a horizontal width of the vacuum transfer module along the short axis of the horizontally elongate vacuum transfer module.

5. The apparatus of claim 1, wherein the first distance is at least 100% of a horizontal width of the vacuum transfer module along the short axis of the horizontally elongate vacuum transfer module.

6. The apparatus of claim 1, the support structure further including a compliance mechanism configured to permit relative displacement between the first centroid and the second centroid of at least 0.022 mm or more when the second set of one or more vacuum transfer module mount points are subjected to a load of less than 400 N directed towards the first centroid while the first set of one or more vacuum transfer module mount points is held fixed in place.

7. The apparatus of claim 6, wherein the compliance mechanism includes one or more items selected from the group consisting of: a) a linear bearing, b) a sliding bushing, c) a sliding contact interface, and d) a serpentine flexure following a serpentine path in the horizontal plane.

8. The apparatus of claim 6, wherein the compliance mechanism is located at least 80% or more of the first distance away from the first centroid and is closer to the second centroid than the first centroid.

9. The apparatus of claim 1, further comprising:
   the base of the vacuum robot arm; and
   a compliant vacuum-rated seal that has an inner mechanical mounting interface that is connected with the base of the vacuum robot arm.

10. The apparatus of claim 9, wherein the compliant vacuum-rated seal is selected from the group consisting of: an axial bellows seal, a radial bellows seal, a flexible diaphragm seal, a flexible wavy diaphragm seal, and an elastomeric seal.

11. The apparatus of claim 9, further comprising the horizontally elongate vacuum transfer module, wherein:
   the horizontally elongate vacuum transfer module includes a housing having a plurality of vertical side walls and having chamber interfaces located at different locations on the vertical side walls around the perimeter of the horizontally elongate vacuum transfer module,
   each chamber interface is configured to connect with a corresponding component for receiving a semiconductor wafer,
   each chamber interface includes an opening sized to allow the semiconductor wafer to be passed through the vertical side wall on which the chamber interface is located,
   the housing defines the horizontal width of the horizontally elongate vacuum transfer chamber and a horizontal length of the horizontally elongate vacuum transfer chamber,
   the horizontal length is at least 1.25 times as large as the horizontal width, and
   the compliant vacuum-rated seal has an outer mechanical mounting interface that is connected with the horizontally elongate vacuum transfer chamber.

12. The apparatus of claim 11, wherein:
   the vacuum transfer module mount points in the first set of one or more vacuum transfer module mount points overlap with one of the vertical side walls when viewed along the rotational axis, and the vacuum transfer module mount points in the second set of one or more vacuum transfer module mount points overlap with another one of the vertical side walls when viewed along the rotational axis.

13. The apparatus of claim 11, wherein:

the horizontally elongate vacuum transfer module further includes a vacuum robot arm mounting plate, the vacuum robot arm mounting plate includes mounting features that align with the first set of vacuum transfer module mount points and the second set of vacuum mount points, the support structure is mounted to the vacuum robot arm mounting plate via the first set of vacuum transfer module mount points and the second set of vacuum mount points, and the vacuum robot arm mounting plate is mounted to the housing.

14. The apparatus of claim 11, wherein the horizontally elongate vacuum transfer module includes at least two chamber interfaces along each of two longer vertical sidewalls.

15. The apparatus of claim 1, wherein:

the horizontally elongate vacuum transfer module includes a housing having a plurality of vertical side walls each having one or more chamber interfaces, each chamber interface is configured to connect with a corresponding component for receiving a semiconductor wafer, each chamber interface includes an opening sized to allow the semiconductor wafer to be passed through the vertical side wall on which the chamber interface is located, and the one or more vacuum transfer module mount points in the first set of one or more vacuum transfer module mount points are positioned so as to interface with mounting features located at an elevation that overlaps with at least one of the openings when viewed along a horizontal axis.

16. The apparatus of claim 1, wherein:

the horizontally elongate vacuum transfer module includes a vacuum robot arm that is configured to position wafers so as to lie in a common wafer transfer plane during wafer transfer operations, and the first centroid and the second centroid are located so as to be proximate to or on the common wafer transfer plane when the support structure is connected with the horizontally elongate vacuum transfer module.

17. The apparatus of claim 1, wherein the support structure is configured to not contact the horizontally elongate vacuum transfer module when installed except at locations proximate to the vacuum transfer module mount points.

18. The apparatus of claim 1, wherein the support structure is a single, contiguous component.

19. The apparatus of claim 1, wherein the support structure includes multiple, separate components.

* * * * *